US012349356B2

(12) United States Patent
Hashimoto

(10) Patent No.: US 12,349,356 B2
(45) Date of Patent: Jul. 1, 2025

(54) SEMICONDUCTOR MEMORY DEVICE THAT INCLUDES A SEMICONDUCTOR COLUMN THAT PENETRATES A PLURALITY OF CONDUCTIVE LAYERS

(71) Applicant: KIOXIA CORPORATION, Tokyo (JP)

(72) Inventor: Toshifumi Hashimoto, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/503,233

(22) Filed: Nov. 7, 2023

(65) Prior Publication Data

US 2024/0081065 A1    Mar. 7, 2024

Related U.S. Application Data

(62) Division of application No. 17/181,027, filed on Feb. 22, 2021, now Pat. No. 11,856,774.

(30) Foreign Application Priority Data

Aug. 12, 2020  (JP) ................. 2020-136487

(51) Int. Cl.
 *H10B 43/27*  (2023.01)
 *H01L 23/00*  (2006.01)
 (Continued)

(52) U.S. Cl.
 CPC ............ *H10B 43/27* (2023.02); *H01L 24/46* (2013.01); *H10B 43/10* (2023.02); *H10D 30/69* (2025.01)

(58) Field of Classification Search
 CPC ........ H10B 43/20; H10B 43/27; H10B 43/30; H10B 43/40; H10B 43/47; H01L 2924/00;
 (Continued)

(56) References Cited

U.S. PATENT DOCUMENTS 7,489,010 B2   2/2009  Takeuchi
7,839,679 B2   11/2010 Hosono et al.
(Continued)

FOREIGN PATENT DOCUMENTS

JP    2006-332424 A    12/2006
JP    2008-227171 A    9/2008
JP    2017-157260 A    9/2017

*Primary Examiner* — Laura M Menz
*Assistant Examiner* — Candice Chan
(74) *Attorney, Agent, or Firm* — Oblon, McClelland, Maier & Neustadt, L.L.P.

(57) ABSTRACT

A semiconductor memory device includes a substrate, a plurality of first conductive layers, a second conductive layer disposed at a position farther from or a position closer to the substrate than the plurality of first conductive layers, a first semiconductor column, a first electric charge accumulating film, a first wiring disposed at a position farther from or a position closer to the substrate than the plurality of first conductive layers and the second conductive layer, a first contact that is disposed between one end of the second conductive layer and the first semiconductor column and is electrically connected to the second conductive layer and the first wiring, and a second contact that is disposed between another end of the second conductive layer and the first semiconductor column and is electrically connected to the second conductive layer and the first wiring.

16 Claims, 34 Drawing Sheets

(51) Int. Cl.
*H10B 43/10* (2023.01)
*H10D 30/69* (2025.01)

(58) Field of Classification Search
CPC ....... H01L 2924/0002; H01L 27/11526; H01L 27/11582
See application file for complete search history.

(56) References Cited

U.S. PATENT DOCUMENTS

| | | |
|---|---|---|
| 8,759,984 B2 | 6/2014 | Saito |
| 10,522,227 B2 | 12/2019 | Kobayashi et al. |
| 10,706,931 B2 | 7/2020 | Maejima |
| 2017/0271362 A1 | 9/2017 | Sonehara |
| 2021/0057336 A1 | 2/2021 | Shao et al. |

SEMICONDUCTOR MEMORY DEVICE THAT INCLUDES A SEMICONDUCTOR COLUMN THAT PENETRATES A PLURALITY OF CONDUCTIVE LAYERS

CROSS-REFERENCE TO RELATED APPLICATIONS

This application is a divisional of and claims benefit under 35 U.S.C. § 120 to U.S. application Ser. No. 17/181,027, filed Feb. 22, 2021, and claims the benefit of priority under 35 U.S.C. § 119 from Japanese Patent Application No. 2020-136487 filed Aug. 12, 2020, the entire contents of each of which are incorporated herein by reference.

BACKGROUND

Field

The embodiment relates to a semiconductor memory device.

Description of the Related Art

There has been known a semiconductor memory device including a substrate, a plurality of first conductive layer arranged in a first direction intersecting with a surface of the substrate and extending in a second direction intersecting with the first direction, a first semiconductor column extending in the first direction and opposed to the plurality of first conductive layers, and a first electric charge accumulating film disposed between the plurality of first conductive layers and the first semiconductor column.

BRIEF DESCRIPTION OF THE DRAWINGS

FIG. 15 is a schematic waveform diagram for describing resistance values in a wiring and the like;

DETAILED DESCRIPTION

Figure 1:
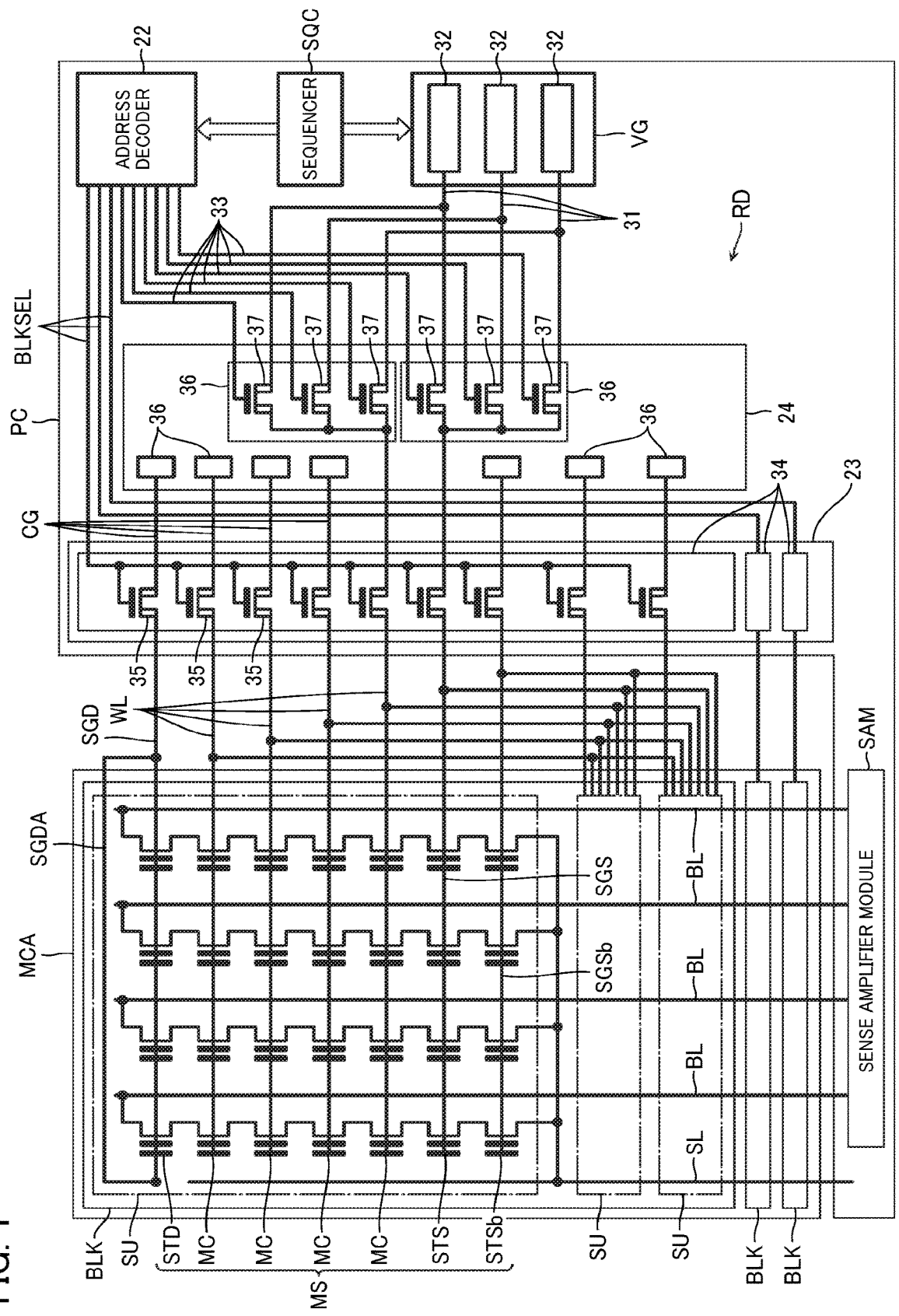
FIG. 1 is a schematic circuit diagram illustrating a configuration of a semiconductor memory device according to a first embodiment.

A semiconductor memory device according to one embodiment includes: a substrate; a plurality of first conductive layers arranged in a first direction intersecting with a surface of the substrate, the plurality of first conductive layers extending in a second direction intersecting with the first direction; a second conductive layer arranged with the plurality of first conductive layers in the first direction, the second conductive layer extending in the second direction, the second conductive layer being disposed at a position farther from the substrate than the plurality of first conductive layers or a position closer to the substrate than the plurality of first conductive layers; a first semiconductor column that extends in the first direction, the first semiconductor column being opposed to the plurality of first conductive layers and the second conductive layer; a first electric charge accumulating film disposed between the plurality of first conductive layers and the first semiconductor column; a first wiring that extends in the second direction, the first wiring being disposed at a position farther from the substrate than the plurality of first conductive layers and the second conductive layer or a position closer to the substrate than the plurality of first conductive layers and the second conductive layer; a first contact disposed between one end in the second direction of the second conductive layer and the first semiconductor column, the first contact being electrically connected to the second conductive layer and the first wiring; and a second contact disposed between another end in the second direction of the second conductive layer and the first semiconductor column, the second contact being electrically connected to the second conductive layer and the first wiring.

A semiconductor memory device according to one embodiment includes: a substrate; a plurality of first conductive layers arranged in a first direction intersecting with a surface of the substrate, the plurality of first conductive layers extending in a second direction intersecting with the first direction; a second conductive layer arranged with the plurality of first conductive layers in the first direction, the second conductive layer extending in the second direction, the second conductive layer being disposed at a position farther from the substrate than the plurality of first conductive layers or a position closer to the substrate than the plurality of first conductive layers; a third conductive layer arranged with the plurality of first conductive layers in the first direction, the third conductive layer being arranged with the second conductive layer in the second direction, the third conductive layer extending in the second direction; a first semiconductor column that extends in the first direction, the first semiconductor column being opposed to the plurality of first conductive layers and the second conductive layer; a second semiconductor column that extends in the first direction, the second semiconductor column being opposed to the plurality of first conductive layers and the third conductive layer; a first electric charge accumulating film disposed between the plurality of first conductive layers and the first semiconductor column; a second electric charge accumulating film disposed between the plurality of first conductive layers and the second semiconductor column; a first wiring that extends in the second direction, the first wiring being disposed at a position farther from the plurality of first conductive layers than the second conductive layer and the third conductive layer; a first contact disposed between an end portion in the second direction of the second conductive layer and the first semiconductor column, the first contact being electrically connected to the second conductive layer and the first wiring; and a second contact disposed between an end portion in the second direction of the third conductive layer and the second semiconductor column, the second contact being electrically connected to the third conductive layer and the first wiring.

Next, the semiconductor memory device according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to "semiconductor memory device," it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to "control circuit," it may mean a peripheral circuit, such as a sequencer disposed in a memory die, it may mean a controller die, a controller chip, or the like connected to the memory die, or it may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the 2nd transistor is in OFF state, the 1st transistor is "electrically connected" to the 3rd transistor.

In this specification, when referring to that the first configuration "is connected between" the second configuration and a third configuration, it may mean that the first configuration, the second configuration, and the third configuration are connected in series, and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a predetermined direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

In this specification, when referring to "width," "length," "thickness," or the like in a predetermined direction for a configuration, a member, and the like, it may mean a width, a length, a thickness, and the like, in a cross-sectional surface or the like observed by, for example, a scanning electron microscopy (SEM) or a transmission electron microscopy (TEM).

First Embodiment

[Circuit Configuration of Semiconductor Memory Device]

FIG. 1 is a schematic block diagram illustrating a configuration of a semiconductor memory device according to a first embodiment.

As illustrated in FIG. 1, the semiconductor memory device includes a memory cell array MCA that stores data and a peripheral circuit PC connected to the memory cell array MCA. The peripheral circuit PC includes a voltage generation circuit VG, a row decoder RD, a sense amplifier module SAM, and a sequencer SQC.

[Circuit Configuration of Memory Cell Array MCA]

The memory cell array MCA includes a plurality of memory blocks BLK. The plurality of these memory blocks BLK each include a plurality of string units SU. The plurality of these string units SU each include a plurality of memory strings MS. The plurality of these memory strings MS each have one end connected to the peripheral circuit PC via bit lines BL. The plurality of these memory strings MS each have the other end connected to the peripheral circuit PC via a common source line SL.

The memory string MS includes a drain-side select transistor STD, a plurality of memory cells MC (memory transistors), a source-side select transistor STS, and a source-side select transistor STSb connected in series between the bit line BL and the source line SL. The following may refer the drain-side select transistor STD, the source-side select transistor STS, and the source-side select transistor STSb to simply as select transistors (STD, STS, STSb).

The memory cell MC is a field-effect type transistor that includes a part of a semiconductor column that functions as a channel region, a gate insulating film that includes an electric charge accumulating film, and a gate electrode. The memory cell MC has a threshold voltage that varies corresponding to an electric charge amount in the electric charge accumulating film. The memory cell MC stores data of one bit or a plurality of bits. The gate electrodes of the plurality of memory cells MC corresponding to one memory string MS are each connected to a word line WL. These word lines WL are each commonly connected to all the memory strings MS in one memory block BLK.

The select transistor (STD, STS, STSb) is a field-effect type transistor that includes a part of the semiconductor column that functions as the channel region, a gate insulating film, and a gate electrode. The gate electrodes of the select transistors (STD, STS, STSb) are connected to the select gate lines (SOD, SGS, SGSb), respectively. The drain side select gate line SOD is disposed to correspond to a string unit SU, and is commonly connected to all the memory strings MS in a one string unit SU. The source side select gate line SGS is commonly connected to all the memory strings MS in the plurality of string units SU. The source side select gate line SGSb is commonly connected to all the memory strings MS in the plurality of string units SU.

Note that, in the illustrated example, the drain side select gate line SGD is connected to the auxiliary wiring SGDA. The auxiliary wiring SGDA has a resistance value smaller than that of the drain side select gate line SGD.

[Circuit Configuration of Voltage Generation Circuit VG]

The voltage generation circuit VG is connected to a plurality of voltage supply lines 31. The voltage generation circuit VG includes, for example, a step down circuit, such as a regulator, and a step up circuit, such as a charge pump circuit 32. These step down circuit and step up circuit are connected to voltage supply lines to which a power supply voltage and a ground voltage are supplied, respectively. The voltage generation circuit VG, for example, generates a plurality of operating voltages applied to the bit line BL, the source line SL, the word line WL, and the select gate lines (SOD, SGS, SGSb) when the read operation, the write operation, and the erase operation are performed to the memory cell array MCA in accordance with a control signal from the sequencer SQC, and simultaneously outputs them to the plurality of voltage supply lines 31. The operating voltage output from the voltage supply line 31 is appropriately adjusted in accordance with the control signal from the sequencer SQC.

[Circuit Configuration of Row Decoder RD]

The row decoder RD includes an address decoder 22 that decodes address data, and a block select circuit 23 and a voltage select circuit 24 that transfer the operating voltage to the memory cell array MCA corresponding to the output signal of the address decoder 22.

The address decoder 22 includes a plurality of block select lines BLKSEL and a plurality of voltage select lines 33. The address decoder 22, for example, sequentially refers to a row address of the address register (not illustrated) in accordance with the control signal from the sequencer SQC, decodes this row address to cause predetermined block select transistor 35 and voltage select transistor 37 corresponding to the row address to be in a state of ON and cause the block select transistors 35 and the voltage select transistors 37 other than the above to be in a state of OFF. For example, the predetermined voltage of the block select line BLKSEL and the voltage select line 33 is turned into "H" state, and the voltage other than it is turned into "L" state. Note that, when a transistor of P channel type, not of N channel type, is used, a reverse voltage is applied to these wirings.

Note that, in the illustrated drawing, the address decoder 22 includes one block select line BLKSEL each for one memory block BLK. However, this configuration is changeable as necessary. For example, one block select line BLKSEL each may be included for two or more memory blocks BLK.

The block select circuit 23 includes a plurality of block selectors 34 that correspond to the memory blocks BLK. The plurality of these block selectors 34 each include the plurality of block select transistors 35 corresponding to the word lines WL and the select gate lines (SGD, SGS, SGSb). The block select transistor 35 is, for example, a field-effect type high voltage transistor. The block select transistors 35 have drain electrodes electrically connected to the respective corresponding word lines WL or select gate lines (SGD, SGS, SGSb). The source electrodes are electrically connected to the respective voltage supply lines 31 via the wirings CG and the voltage select circuit 24. The gate electrodes are commonly connected to the corresponding block select line BLKSEL.

Note that the block select circuit 23 further includes a plurality of transistors (not illustrated). The plurality of these transistors are field-effect type high voltage transistors connected between the select gate lines (SGD, SGS, SGSb) and the voltage supply line to which the ground voltage $V_{ss}$ is supplied. The plurality of these transistors supply the ground voltage $V_{ss}$ to the select gate lines (SGD, SGS, SGSb) included in a non-selected memory block BLK. Note that the plurality of word lines WL included in the non-selected memory block BLK enter a floating state.

The voltage select circuit 24 includes a plurality of voltage selectors 36 that correspond to the word lines WL and the select gate lines (SGD, SOS, SGSb). The plurality of these voltage selectors 36 each include the plurality of voltage select transistors 37. The voltage select transistor 37 is, for example, a field-effect type high voltage transistor. The voltage select transistors 37 have drain terminals each electrically connected to the corresponding word lines WL or select gate lines (SGD, SGS, SGSb) via the wirings CG and the block select circuit 23. The source terminals are electrically connected to the respective corresponding voltage supply lines 31. The gate electrodes are connected to the respective corresponding voltage select lines 33.

Note that, in the illustrated drawing, the example where the wiring CG is connected to the voltage supply line 31 via one voltage select transistor 37 is illustrated. However, such a configuration is merely an example, and the specific configuration is adjustable as necessary. For example, the wiring CG may be connected to the voltage supply line 31 via two or more voltage select transistors 37.

[Circuit Configuration of Sense Amplifier Module SAM]

The sense amplifier module SAM includes, for example, a plurality of sense amplifier units corresponding to a plurality of bit lines BL. The sense amplifier units each include a sense amplifier connected to the bit line BL. The sense amplifier includes a sense circuit connected to the bit line BL, a voltage transfer circuit connected to the bit line BL, and a latch circuit connected to the sense circuit and the voltage transfer circuit. The sense circuit includes a sense transistor caused to be in the ON state corresponding to the voltage or the current of the bit line BL and a wiring charged or discharged in accordance with ON/OFF state of the sense transistor. The latch circuit latches data of "1" or "0" according to the voltage of this wiring. The voltage transfer circuit causes the bit line BL to be electrically conducted with any one of the two voltage supply lines according to the data latched by this latch circuit.

[Circuit Configuration of Sequencer SQC]

The sequencer SQC outputs an internal control signal to the row decoder RD, the sense amplifier module SAM, and the voltage generation circuit VG in accordance with command data held in a command register (not illustrated). The sequencer SQC also outputs status data indicative of a state of itself to a status register (not illustrated) as necessary.

[Structure of Semiconductor Memory Device]

Figure 2:
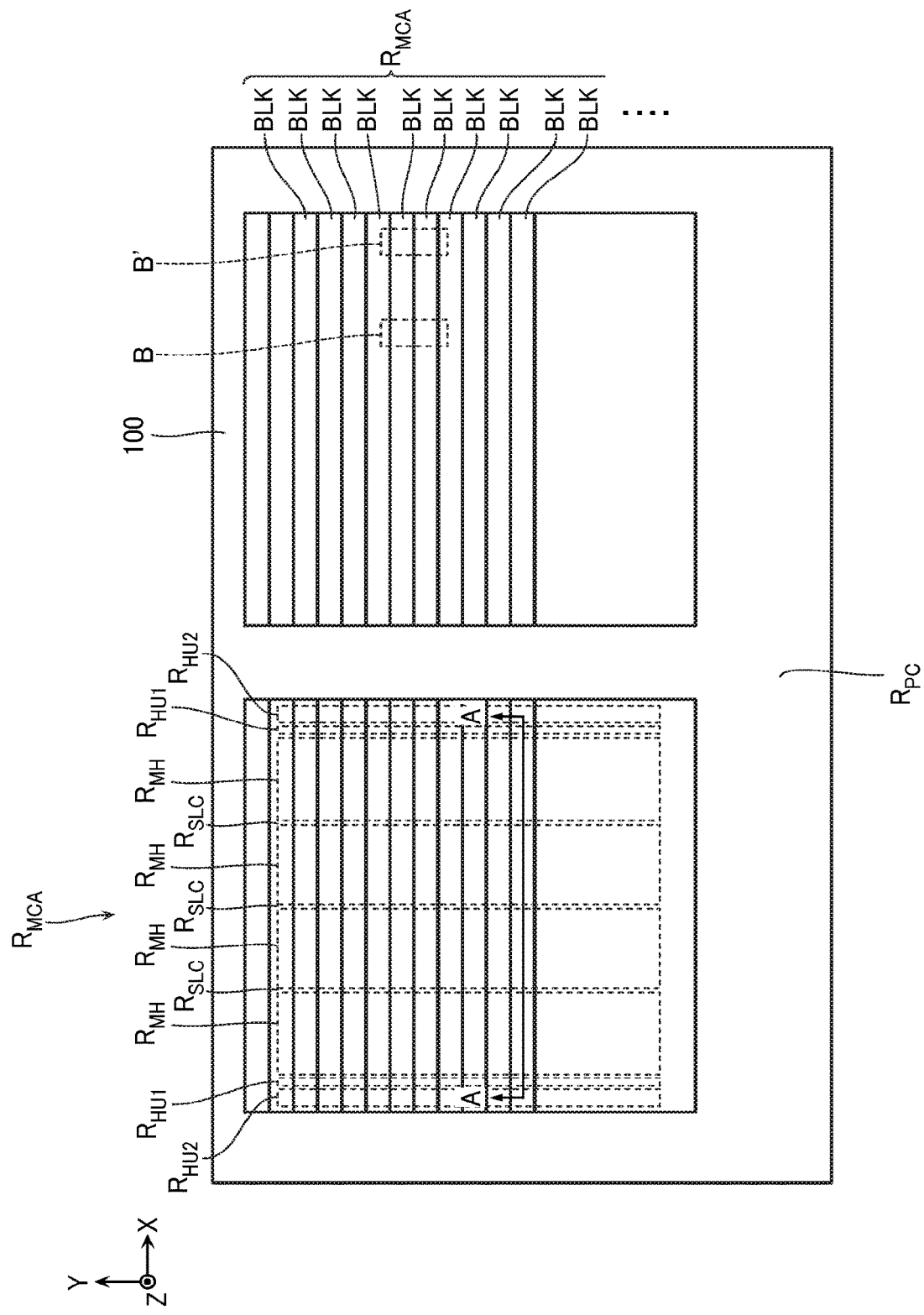
FIG. 2 is a schematic plan view of the semiconductor memory device.
Figure 3:
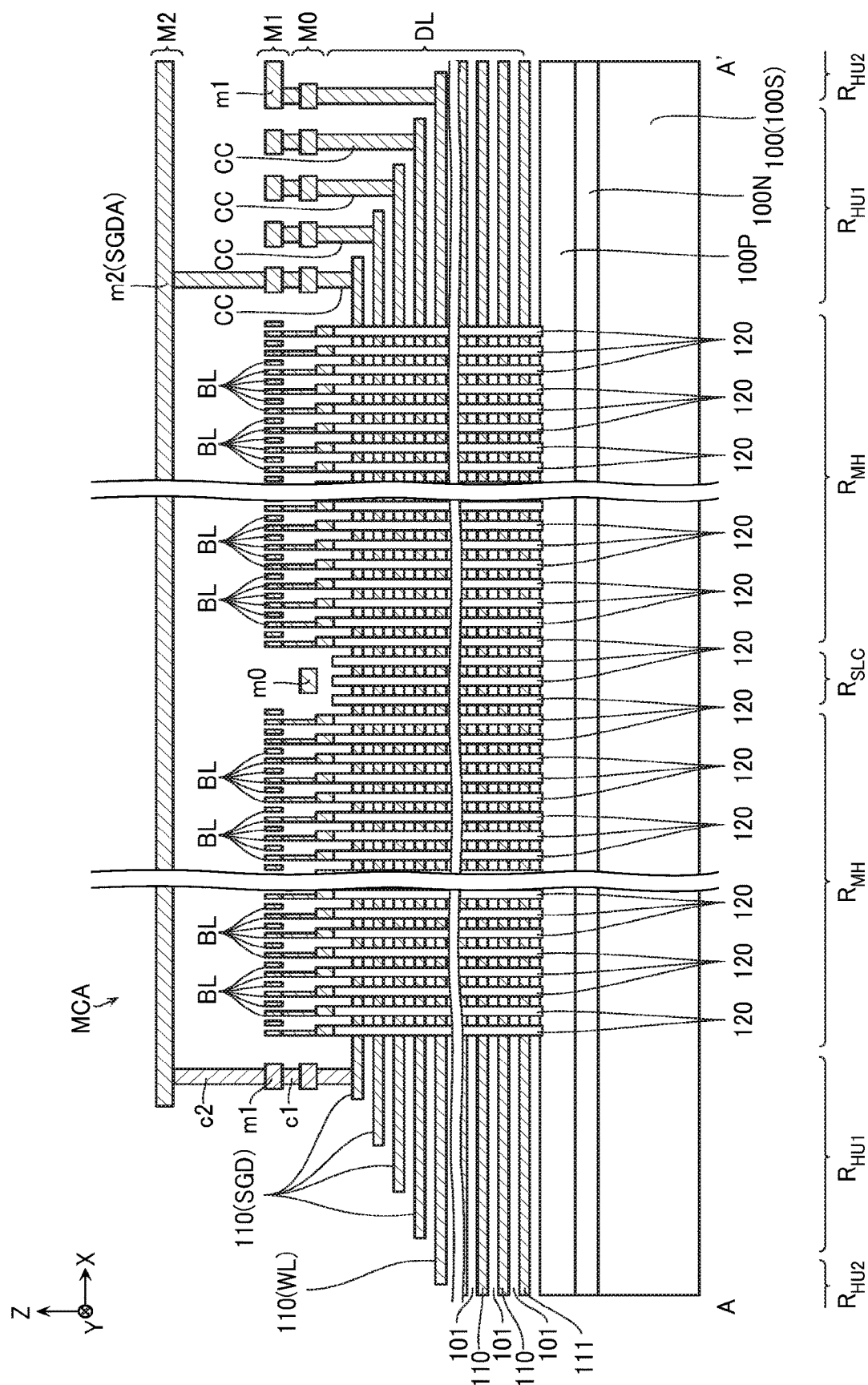
FIG. 3 is a schematic cross-sectional view taking the structure illustrated in FIG. 2 along the line A-A' and viewed in the direction of the arrow.
Figure 4:
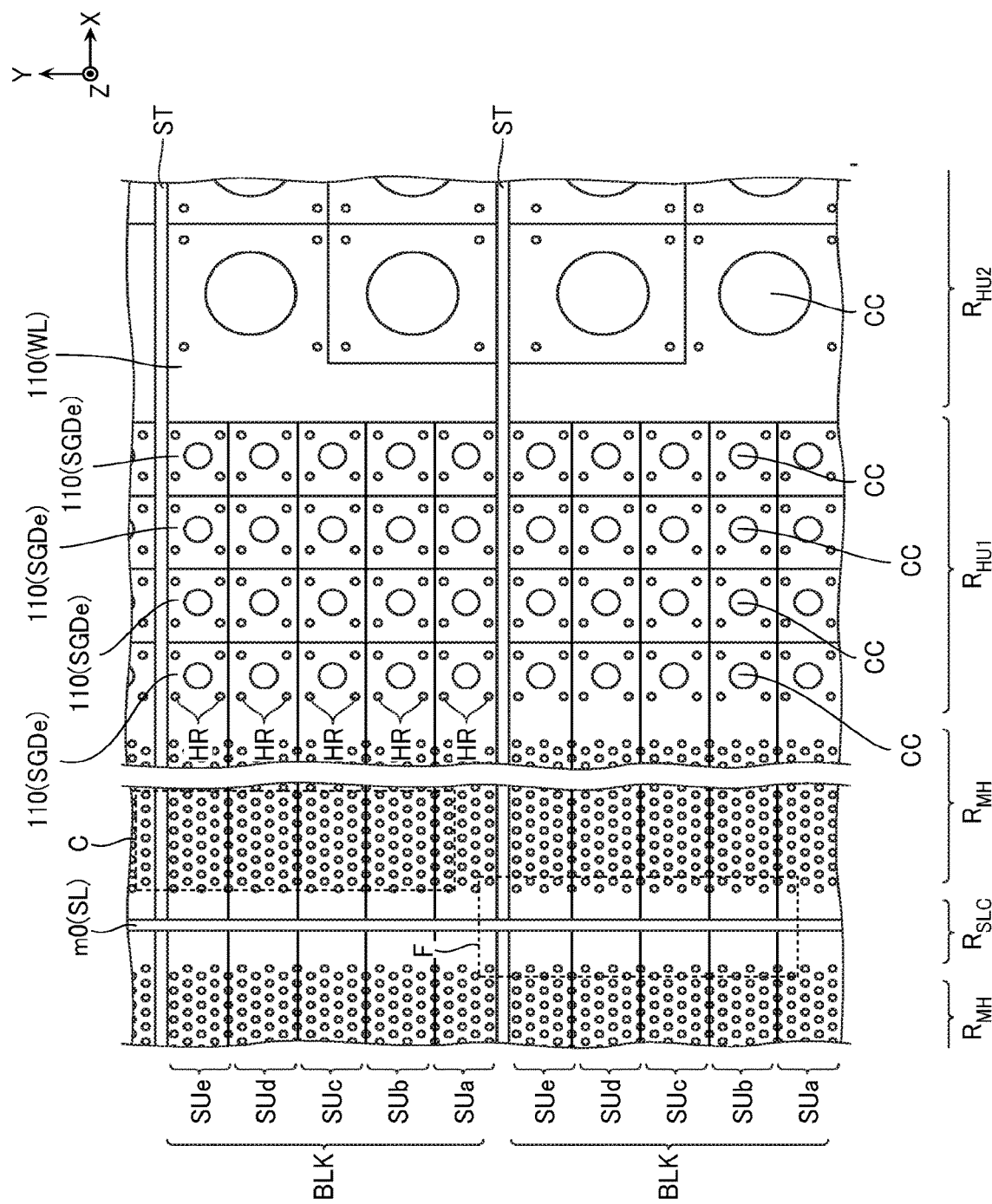
FIG. 4 is a schematic enlarged view of a portion illustrated in B in FIG. 2.
Figure 5:
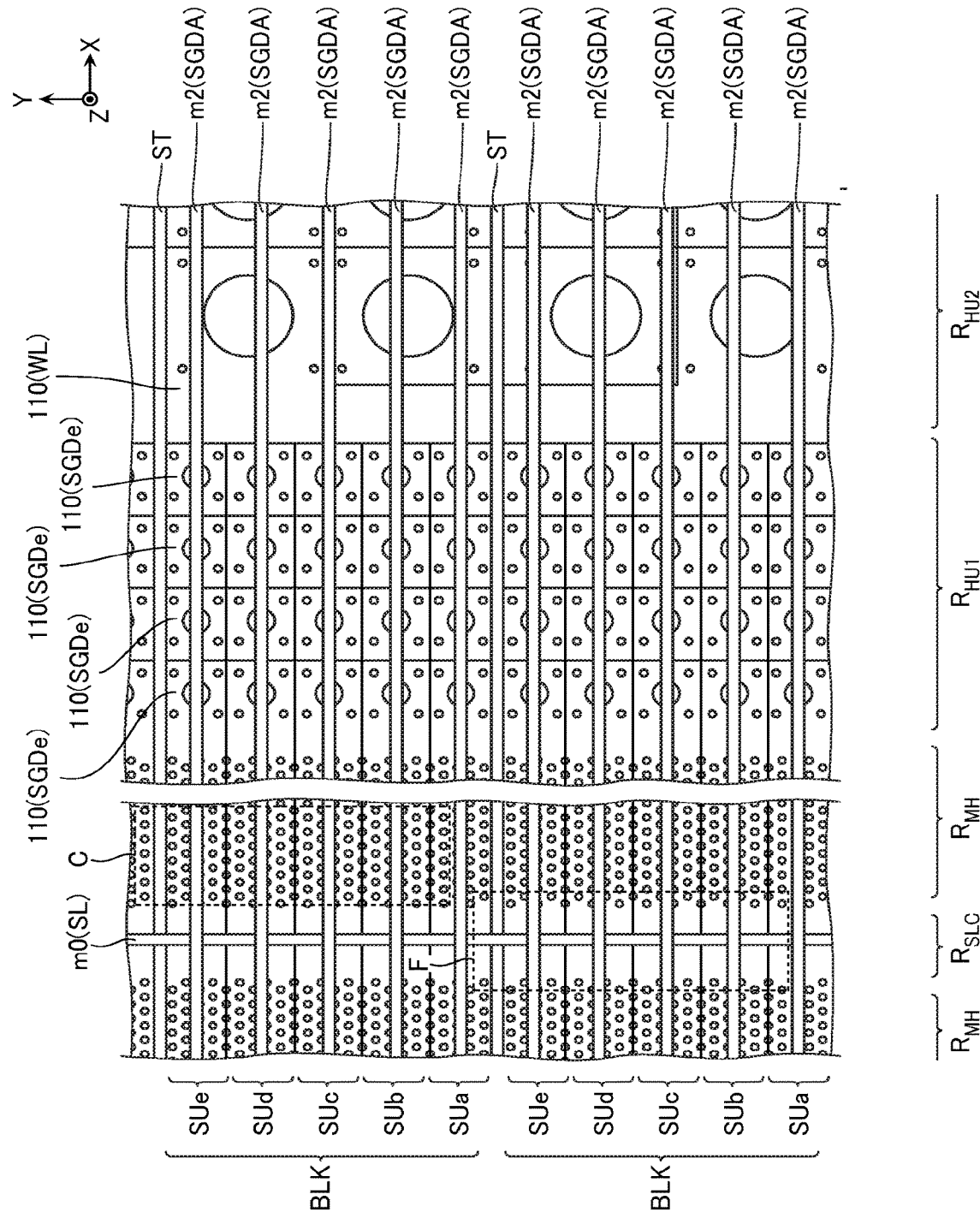
FIG. 5 is a schematic enlarged view of a portion illustrated in B in FIG. 2.
Figure 6:
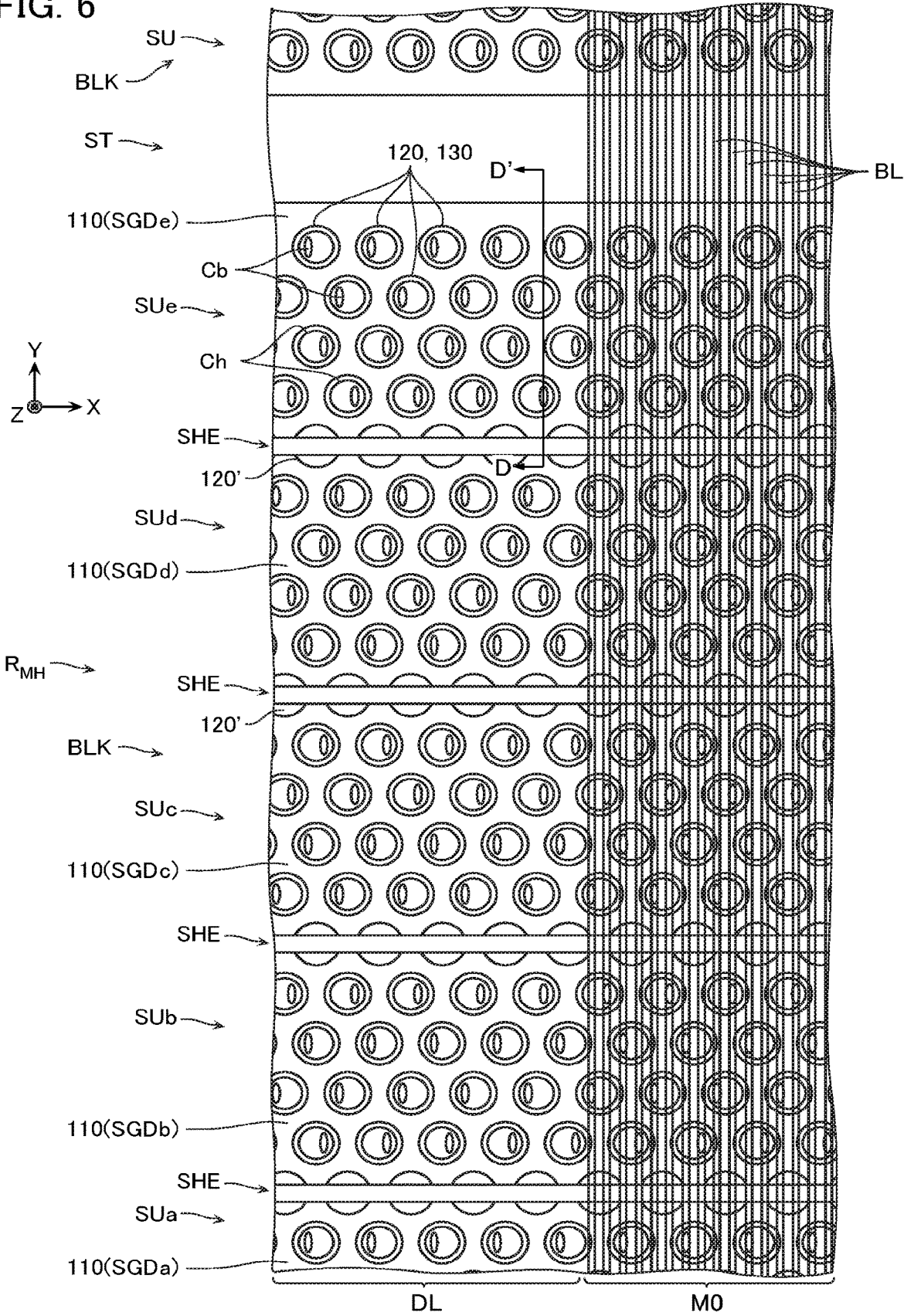
FIG. 6 is a schematic enlarged view of a region illustrated in FIG. 4.
Figure 7:
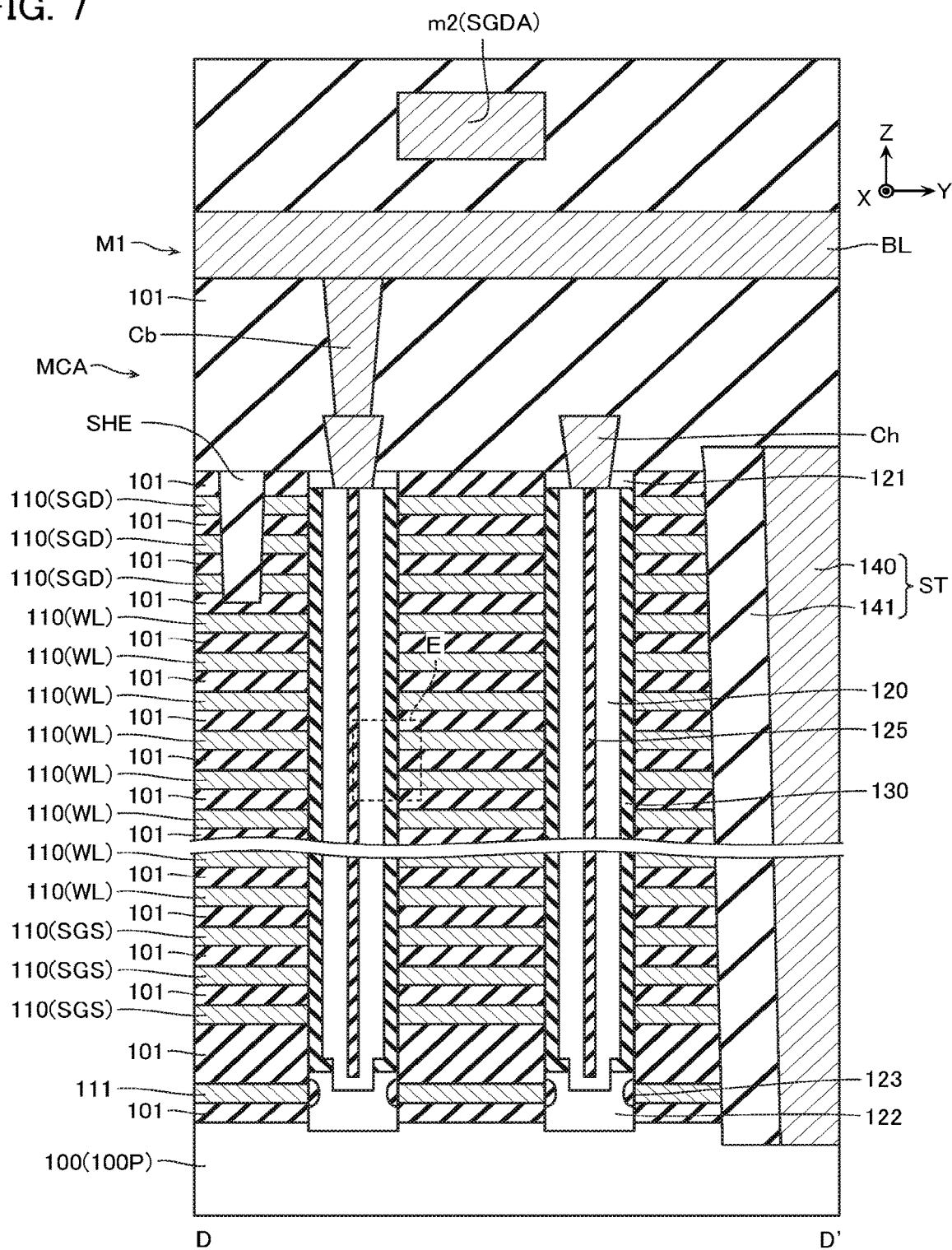
FIG. 7 is a schematic cross-sectional view taking the structure illustrated in FIG. 6 along the line C-C' and viewed in the direction of the arrow.
Figure 8:
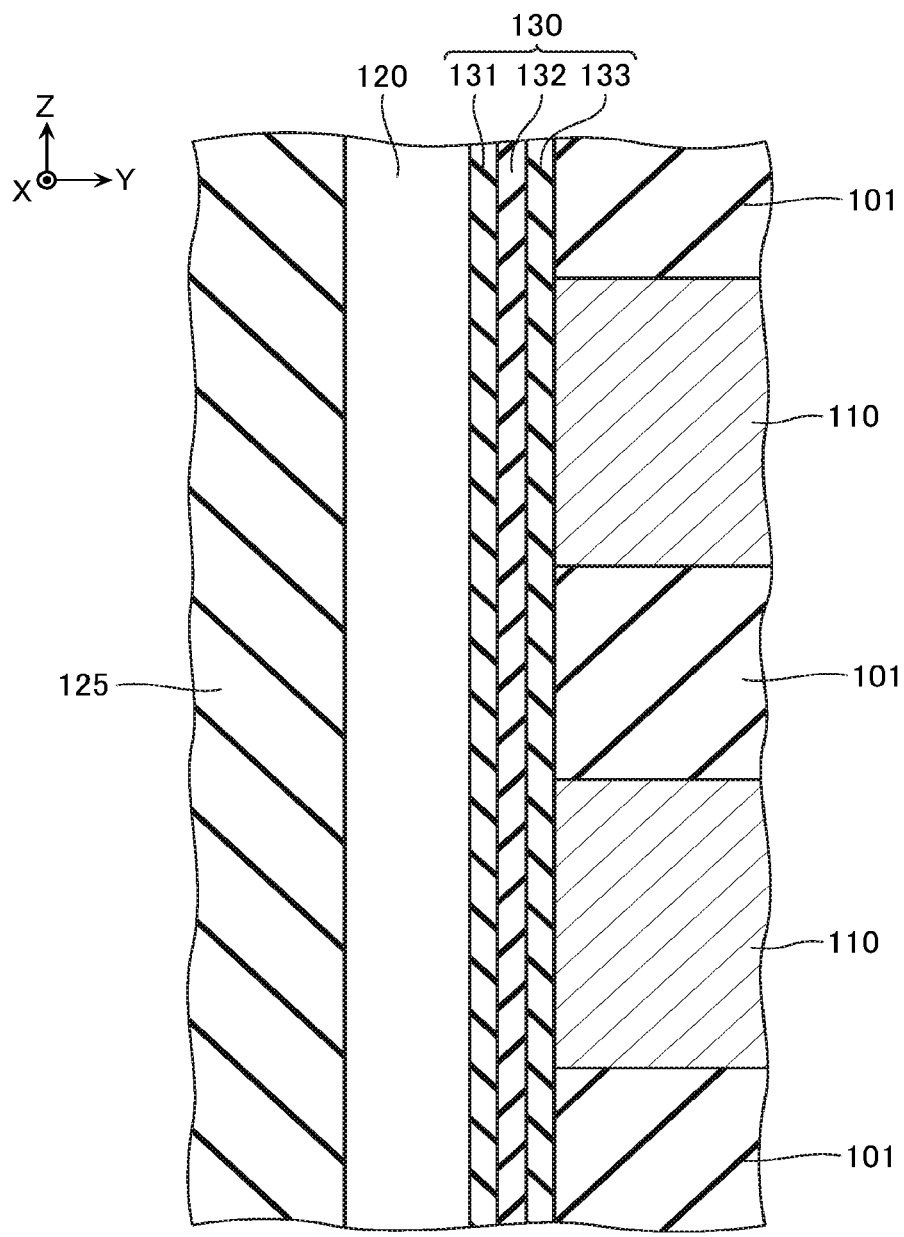
FIG. 8 is a schematic enlarged view of a portion illustrated in D in FIG. 7.
Figure 9:
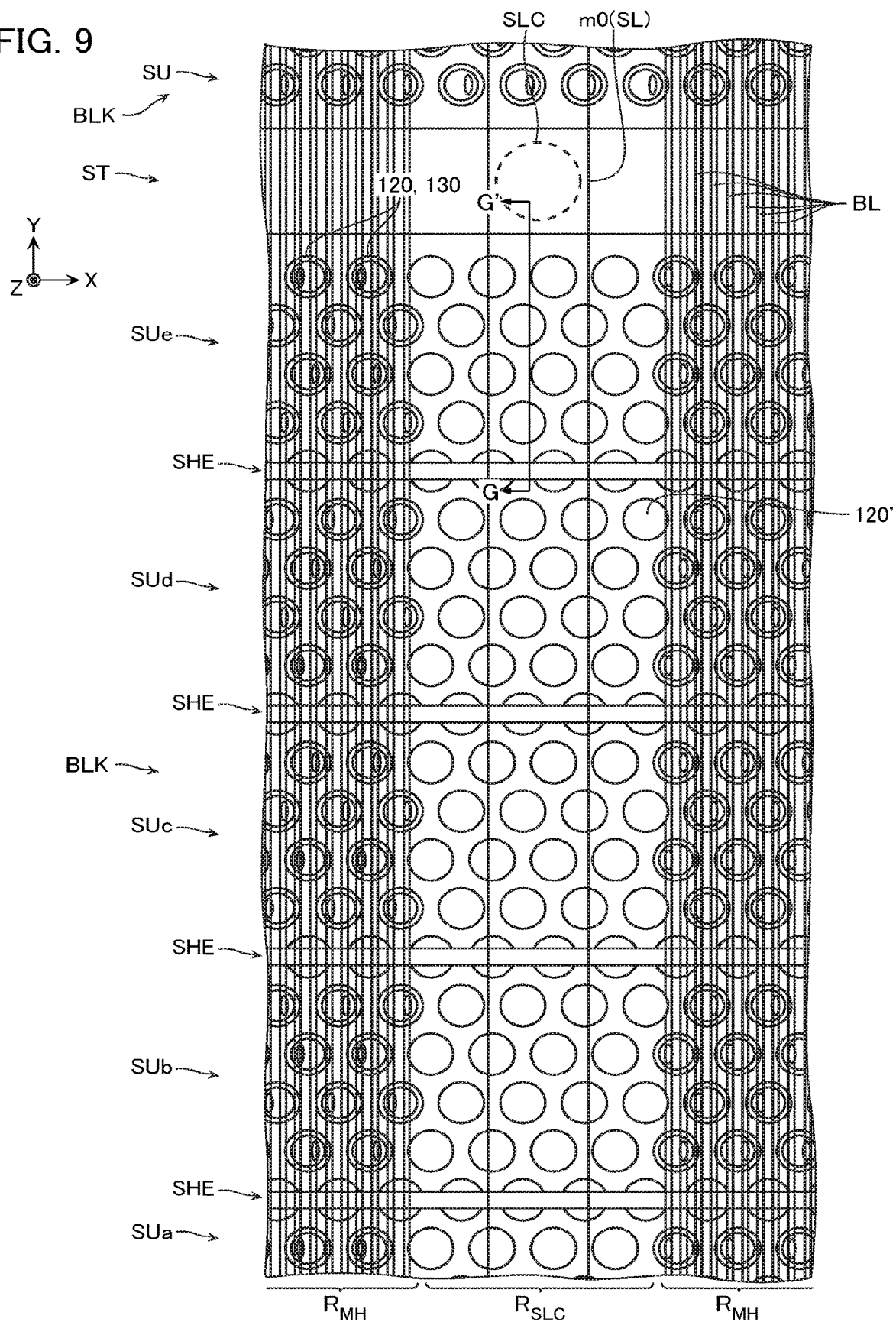
FIG. 9 is a schematic enlarged view of a portion illustrated in FIG. 4.
Figure 10:
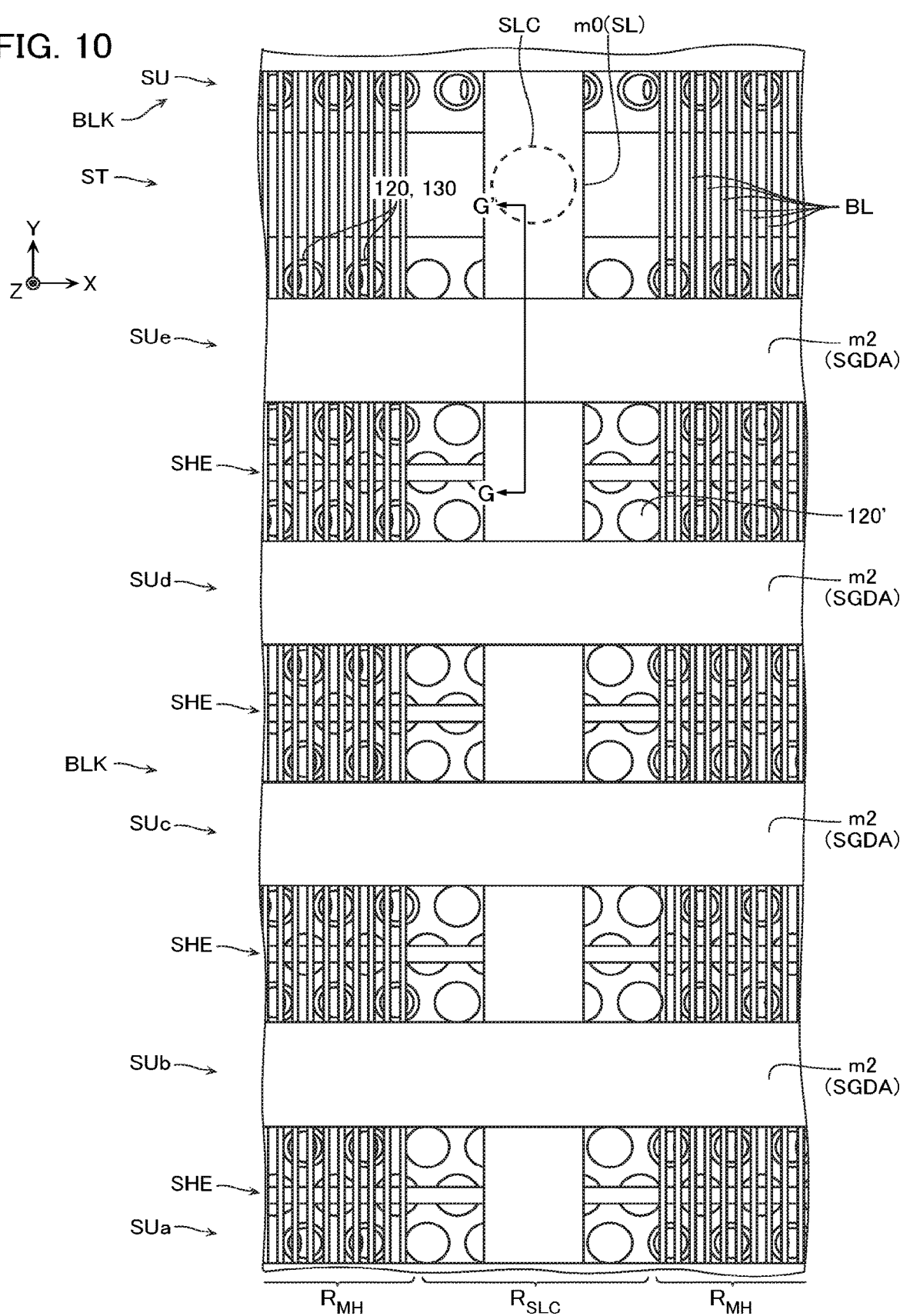
FIG. 10 is a schematic enlarged view of a portion illustrated in FIG. 5.
Figure 11:
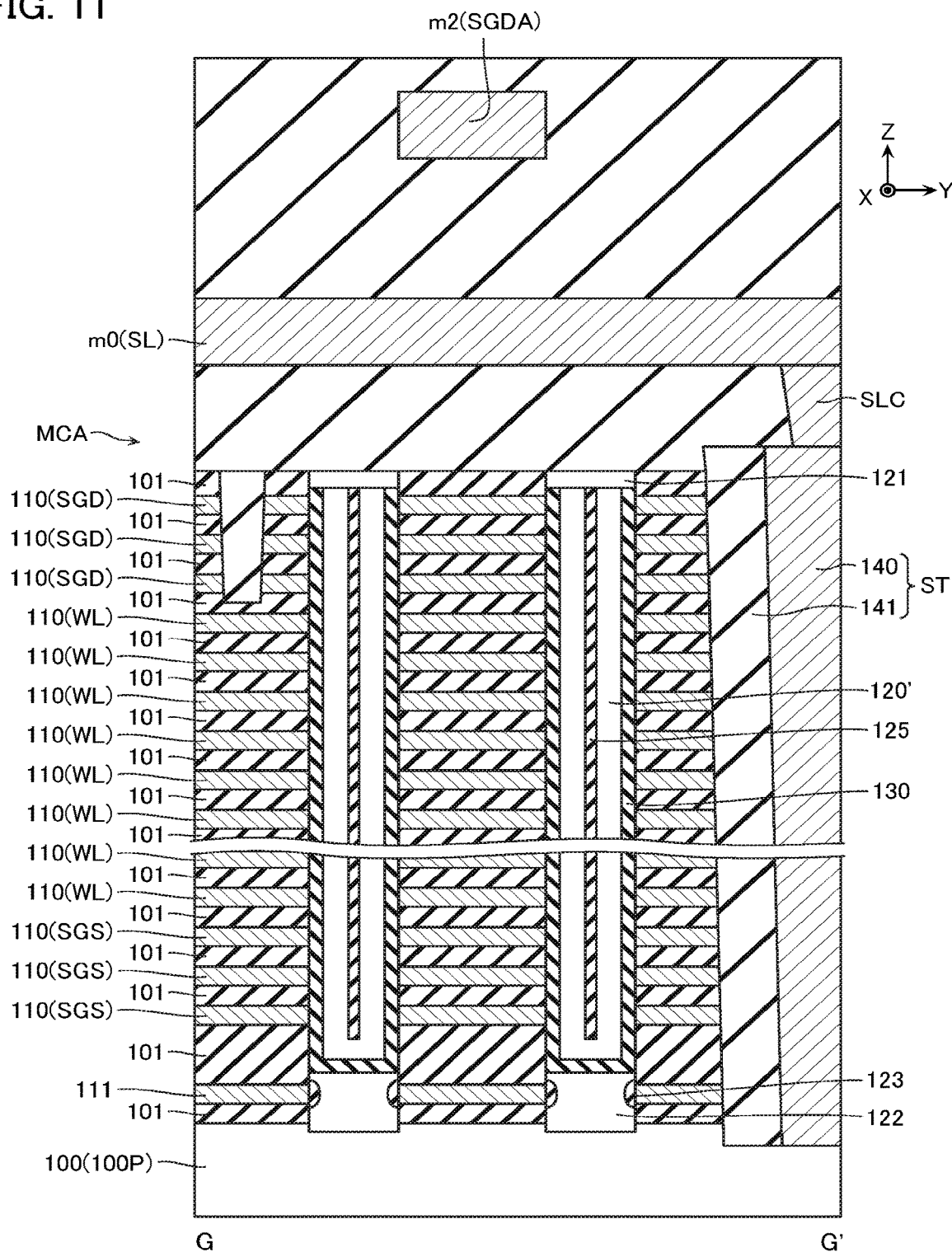
FIG. 11 is a schematic cross-sectional view taking a structure illustrated in FIG. 9 and FIG. 10 along the line E-E' and viewed in the direction of the arrow.

FIG. 2 is a schematic plan view of the semiconductor memory device. FIG. 3 is a schematic cross-sectional view taking the structure illustrated in FIG. 2 along the line A-A' and viewed in the direction of the arrow. FIG. 4 and FIG. 5 are schematic enlarged views of a portion illustrated in B and a portion illustrated in B' in FIG. 2. However, in FIG. 4, a part of configuration illustrated in FIG. 5 is omitted. FIG. 6 is a schematic enlarged view of a portion illustrated in C in FIG. 4. FIG. 7 is a schematic cross-sectional view taking the structure illustrated in FIG. 6 along the line D-D' and viewed in the direction of the arrow. FIG. 8 is a schematic enlarged view of a portion illustrated in E in FIG. 7. FIG. 9 and FIG. 10 are schematic enlarged views of portions illustrated in F in FIG. 4 and FIG. 5. However, FIG. 9 omits a part of the configuration illustrated in FIG. 10. FIG. 11 is a schematic cross-sectional view taking the structure illustrated in FIG. 9 and FIG. 10 along the line G-G' and viewed in the direction of the arrow.

As illustrated in FIG. 2, the semiconductor memory device includes a semiconductor substrate 100. In the illustrated example, the semiconductor substrate 100 includes two memory cell array regions $R_{MCA}$ arranged in the X-direction. The memory cell array region $R_{MCA}$ includes a plurality of memory hole regions $R_{MH}$ arranged in the X-direction and source line contact regions $R_{SLC}$ disposed between the two memory hole regions $R_{MH}$ arranged in the X-direction. The memory cell array region $R_{MCA}$ has end portions in the X-direction where first hook-up regions $R_{HU1}$ and second hook-up regions RE arranged farther from the memory hole region $R_{MH}$ than the first hook-up regions $R_{HU1}$ are disposed. A peripheral circuit area $R_{PC}$ is disposed in a region outside the memory cell array region $R_{MCA}$.

The memory cell array region $R_{MCA}$ includes a plurality of memory blocks BLK arrange in the Y-direction. The plurality of these memory blocks each extend in the X-direction from one end in the X-direction of the memory cell array region $R_{MCA}$ and to the other end. The memory block BLK includes five string units SU arranged in the Y-direction, for example, as illustrated in FIG. 4. Between the two memory blocks BLK adjacent in the Y-direction, an inter-block structure ST is disposed.

Note that, in the following description, the five string units SU in the memory block BLK are each referred to as string units SUa, SUb, SUc, SUd, SUe in some cases. The drain side select gate lines SGD corresponding to the string units SUa, SUb, SUc, SUd, SUe are each referred to as drain side select gate lines SGDa, SGDb, SGDc, SGDd, SGDe in some cases.

As illustrated in FIG. 3, the semiconductor memory device includes a device layer DL disposed on the semiconductor substrate 100, a wiring layer M0 disposed on the upper side of the device layer DL, a wiring layer M1 disposed on the upper side of the wiring layer M0, and a wiring layer M2 disposed on the upper side of the wiring layer M1.

[Structure of Semiconductor Substrate 100]

The semiconductor substrate 100 is, for example, a semiconductor substrate made of a P-type silicon (Si) including P-type impurities, such as boron (B). For example, as illustrated in FIG. 3, the semiconductor substrate 100 has a surface where, for example, an N-type well region 100N including N-type impurities, such as phosphorus (P), and a P-type well region 100P including the P-type impurities, such as boron (B), are disposed. Note that, in the peripheral circuit area $R_{PC}$ (FIG. 2), the surface of the semiconductor substrate 100 includes, for example, a channel region of a plurality of transistors Tr that constitute the peripheral circuit PC.

[Structure in Memory Hole Region $R_{MH}$ of Device Layer DL]

For example, as illustrated in FIG. 6 and FIG. 7, the memory hole region $R_{MH}$ includes a plurality of conductive layers 110 arranged in the Z-direction, a plurality of semiconductor columns 120, 120' extend in the Z-direction, and a plurality of gate insulating films 130 each disposed between the plurality of conductive layers 110 and the plurality of semiconductor columns 120, 120'.

The conductive layer 110 is an approximately plate-shaped conductive layer extending the X-direction. The conductive layer 110 may include a stacked film of a barrier conductive film, such as titanium nitride (TiN), and a metal film, such as tungsten (W), or the like. The conductive layer 110 may include polycrystalline silicon and the like including impurities, such as phosphorus (P) or boron (B). For example, as illustrated in FIG. 7, an insulating layer 101 of, for example, silicon oxide ($SiO_2$) is disposed between the plurality of conductive layers 110 arranged in the Z-direction.

Below the conductive layers 110, a conductive layer 111 is disposed. The conductive layer 111 may include a stacked film of a barrier conductive film, such as titanium nitride (TiN), and a metal film, such as tungsten (W), or the like. Between the conductive layer 111 and the conductive layer 110, the insulating layer 101 of, for example, silicon oxide ($SiO_2$) is disposed.

The conductive layer 111 functions as the source side select gate line SGSb (FIG. 1) and gate electrodes of the plurality of source-side select transistors STSb connected to the source side select gate line SGSb. The conductive layers 111 are electrically independent in every memory block BLK. The conductive layer 111 has both ends in the Y-direction connected to an insulating layer 141 in the inter-block structure ST.

The plurality of conductive layers 110 positioned in the lowermost layer among the plurality of conductive layers 110 function as the source side select gate line SGS (FIG. 1) and gate electrodes of the plurality of source-side select transistors STS connected to the source side select gate line SGS. The plurality of these conductive layers 110 are electrically independent in every memory block BLK. The plurality of these conductive layers 110 have both ends in the Y-direction connected to the insulating layer 141 in the inter-block structure ST. Note that, in the following description, such a conductive layer 110 is referred to as the conductive layer 110 (SGS) in some cases.

The plurality of conductive layers 110 positioned above the conductive layer 110 (SGS) function as the word line WL (FIG. 5) and gate electrodes of the plurality of memory cells MC (FIG. 1) connected to the word line WL. The plurality of these conductive layers 110 are each electrically independent in every memory block BLK. The plurality of these conductive layers 110 have both ends in the Y-direction connected to the insulating layer 141 in the inter-block structure ST. Note that, in the following description, such a conductive layer 110 is referred to the conductive layer 110 (WL) in some cases.

The plurality of conductive layers 110 positioned above the conductive layer 110 (WL) function as the drain side select gate line SGD and gate electrodes of the plurality of drain-side select transistors STD (FIG. 1) connected to the drain side select gate line SGD. For example, as illustrated in FIG. 6 and FIG. 7, between the two conductive layers 110 adjacent in the Y-direction among the plurality of these conductive layers 110, an inter-string unit insulating layer SHE of, for example, silicon oxide ($SiO_2$) and the semiconductor column 120' periodically arranged in the X-direction are disposed. The plurality of these conductive layers 110 are each electrically independent in every string unit SU. Note that, in the following description, such a conductive layer 110 is referred to as the conductive layer 110 (SGD) in some cases.

The conductive layer 110 (SGD) has a width in the Y-direction smaller than a width of the conductive layer 110 (WL). For example, in the example in FIG. 4, five conductive layers 110 (SGD) arranged in the Y-direction and four inter-string unit insulating layers SHE arranged in the Y-direction are disposed corresponding to one conductive layer 110 (WL). Accordingly, in the illustrated example, the width in the Y-direction of the conductive layer 110 (SGD) is smaller than ⅕ the width in the Y-direction of the conductive layer 110 (WL).

The conductive layers 110 functioning as the drain side select gate lines SGDa and SGDe (hereinafter, referred to as the conductive layer 110 (SGDa) and the conductive layer 110 (SGDe) in some cases), for example, as illustrated in FIG. 6, have end portions at one side in the Y-direction formed into approximately straight lines along the inter-block structures ST extending in straight lines in the X-direction. On the other hand, the conductive layer 110 (SGDa) and the conductive layer 110 (SGDe) have end portions at the other side in the Y-direction having shapes periodically meandering along the inter-string unit insulating layer SHE extending in the X-direction and a side surface in the Y-direction of the semiconductor column 120' periodically disposed in the X-direction.

The conductive layers 110 functioning as the drain side select gate lines SGDb, SGDc, SGDd (hereinafter referred to as the conductive layer 110 (SGDb), the conductive layer 110 (SGDc), and the conductive layer 110 (SGDd) in some cases) have both ends in the Y-direction having shapes periodically meandering along the inter-string unit insulating layer SHE extending in the X-direction and a side surface in the Y-direction of the semiconductor column 120' periodically disposed in the X-direction.

The semiconductor columns 120, 120' are arranged in a predetermined pattern in the X-direction and the Y-direction, for example, as illustrated in FIG. 6. The semiconductor column 120 functions as channel regions of the plurality of memory cells MC and the select transistors (STD, STS, STSb) included in one memory string MS (FIG. 1). While the semiconductor column 120' is configured approximately similarly to the semiconductor column 120, it does not function as the memory cell MC and the like. The semiconductor columns 120, 120' are semiconductor layers of, for example, polycrystalline silicon (Si). The semiconductor columns 120, 120', for example, as illustrated in FIG. 7, have approximately closed-bottomed cylindrical shapes and include insulating layers 125 of, for example, silicon oxide in the center portions. The semiconductor columns 120, 120' have outer peripheral surfaces each surrounded by the conductive layer 110 and opposed to the conductive layer 110.

The semiconductor column 120 has an upper end portion where an impurity region 121 including N-type impurities, such as phosphorus (P), is disposed. The impurity region 121 is connected to the bit line BL via a contact Ch and a contact Cb.

The semiconductor column 120 has a lower end portion connected to the P-type well region 100P of the semiconductor substrate 100 via a semiconductor column 122 made of, for example, single-crystal silicon (Si). The semiconductor column 122 functions as a channel region of the source-side select transistor STSb. The semiconductor column 122 has an outer peripheral surface surrounded by the conductive layer 111 and opposed to the conductive layer 111. Between the semiconductor column 122 and the conductive layer 111, an insulating layer 123 of, for example, silicon oxide is disposed.

The gate insulating film 130 has an approximately cylindrical shape to cover the outer peripheral surfaces of the semiconductor columns 120, 120'.

The gate insulating film 130 includes, for example, as illustrated in FIG. 8, a tunnel insulating film 131, an electric charge accumulating film 132, and a block insulating film 133, stacked between the semiconductor column 120 and the conductive layers 110. The tunnel insulating film 131 and the block insulating film 133 are, for example, insulation films of, for example, silicon oxide ($SiO_2$). The electric charge accumulating film 132 is, for example, a film of silicon nitride ($Si_3N_4$), configured to accumulate an electric charge. The tunnel insulating film 131, the electric charge accumulating film 132, and the block insulating film 133 have approximately cylindrical shapes and extend in the Z-direction along the outer peripheral surface of the semiconductor column 120.

Note that, FIG. 8 illustrates an example where the gate insulating film 130 includes the electric charge accumulating film 132 of, for example, silicon nitride. However, the gate insulating film 130 may include, for example, a floating gate of, for example, polycrystalline silicon including N-type or P-type impurities.

The inter-block structure ST includes, for example, as illustrated in FIG. 7, a conductive layer 140 extending in the Z-direction and the X-direction and the insulating layer 141 disposed on a side surface of the conductive layer 140. The conductive layer 140 is connected to the N-type impurity region disposed in the P-type well region 100P of the semiconductor substrate 100. The conductive layer 140 may include a stacked film of a barrier conductive film, such as titanium nitride (TiN), and a metal film, such as tungsten (W), or the like. The conductive layer 140 functions, for example, as a part of the source line SL (FIG. 1).

[Structure of Device Layer DL in Source Line Contact Region $R_{SLC}$]

The source line contact region $R_{SLC}$ includes, for example, as illustrated in FIG. 9 and FIG. 11, the plurality of conductive layers 110 arranged in the Z-direction, the plurality of semiconductor columns 120' extending in the Z-direction, and the plurality of gate insulating films 130 respectively disposed between the plurality of conductive layers 110 and the plurality of semiconductor columns 120'.

The source line contact region $R_{SLC}$ includes a source line contact SLC connected to an upper end of the conductive layer 140. The source line contact SLC may, for example, include a stacked film of a barrier conductive film, such as titanium nitride (TiN), and a metal film, such as tungsten (W), or the like.

[Structure of Device Layer DL in First Hook-Up Region $R_{HU1}$]

As illustrated in FIG. 3, the first hook-up region $R_{HU1}$ includes end portions in the X-direction of the plurality of conductive layers 110 (SGD). The first hook-up region $R_{HU1}$ includes a plurality of contacts CC. The plurality of these contacts CC extend in the Z-direction and are connected to the conductive layers 110 (SGD) at lower ends. The contact CC may, for example, include a stacked film of a barrier conductive film, such as titanium nitride (TiN), and a metal film, such as tungsten (W), or the like.

As illustrated in FIG. 4, the end portions in the X-direction of the plurality of conductive layers 110 (SGD) arranged in matrix viewing from the Z-direction. The contacts CC are disposed to correspond to these end portions and are respectively connected the plurality of conductive layers 110 (SGD). In the example in FIG. 4, the plurality of contacts CC arranged in the X-direction are all connected the conductive layer 110 (SGD) corresponding to the same string unit SU. The plurality of contacts CC arranged in the Y-direction are all connected the conductive layers 110 (SGD) corresponding to the different string units SU.

The first hook-up region $R_{HU1}$ has supporting structures HR disposed at the proximity of the contact CC. The supporting structure HR may, for example, include a structure similar to the semiconductor column 120' and the gate insulating film 130, or may be an insulating layer of, for example, silicon oxide ($SiO_2$), extending in the Z-direction.

[Structure of Device Layer DL in Second Hook-Up Region $R_{HU2}$]

As illustrated in FIG. 3, the second hook-up region $R_{HU2}$ includes end portions in the X-direction of the plurality of conductive layers 110 (WL) and 110 (SGS). The second hook-up region $R_{HU2}$ includes the plurality of contacts CC. The plurality of these contacts CC extend in the Z-direction and are connected to the conductive layers 110 (WL) and 110 (SGS) at lower ends.

As illustrated in FIG. 4, the end portions in the X-direction of the plurality of conductive layers 110 (WL) and 110 (SGS) are arranged in matrix viewing from the Z-direction. The contacts CC are disposed to correspond to these end portions and are respectively connected to the plurality of conductive layers 110 (WL) and 110 (SGS). In the example in FIG. 4, the plurality of contacts CC arranged in the X-direction are connected to even-numbered or odd-numbered conductive layers 110 (WL) and 110 (SGS) corresponding to the same memory block BLK. The two contacts CC arranged in the Y-direction are connected to the conductive layers 110 (WL) and 110 (SGS) corresponding to the same memory block BLK.

The second hook-up region $R_{HU2}$ have the supporting structures HR disposed at the proximity of the contact CC.

[Structure of Wiring Layers M0, M1, M2]

For example, as illustrated in FIG. 3, a plurality of wirings included in wiring layers M0, M1, M2 are, for example, electrically connected to at least one of the configuration in the memory cell array MCA and the configuration in the peripheral circuit PC via the above-described contact CC or the like.

The wiring layers M0, for example, as illustrated in FIG. 3, each include a plurality of wirings m0. The plurality of these wirings m0 may, for example, include a stacked film of a barrier conductive film, such as titanium nitride (TiN), and a metal film, such as tungsten (W), or the like. The wiring m0 is disposed above the upper end of the contact CC. At least a part of the wiring m0 is connected to the configuration in the device layer DL via the contact CC and the like.

Note that, a part of the plurality of wirings m0 functions as a part of the source line SL (FIG. 1). This wiring m0 is disposed in the source line contact region $R_{SLC}$ and extends in the Y-direction, for example, as illustrated in FIG. 4. This wiring m0 is connected to the conductive layer 140 via the source line contact SLC as illustrated in FIG. 10 and FIG. 11.

The wiring layers M1, for example, as illustrated in FIG. 3, each include a plurality of wirings m1. The plurality of these wirings m1 may, for example, include a stacked film of a barrier conductive film, such as titanium nitride (TiN), and a metal film, such as Copper (Cu), or the like. The wiring m1 is disposed above the wiring m0. At least a part of the wiring m1 is connected to the wiring m0 via a contact c1 and the like.

Note that, a part of the plurality of wirings m1 functions as the bit line BL (FIG. 1). The bit line BL, for example, as illustrated in FIG. 6, are arranged in the X-direction, extends in the Y-direction. As described above, the plurality of these bit lines BL are each connected to one semiconductor column 120 included in each string unit SU.

The wiring layers M2, for example, as illustrated in FIG. 3, each include a plurality of wirings m2. The plurality of these wirings m2 may, for example, include a stacked film of a barrier conductive film, such as titanium nitride (TiN), and a metal film, such as copper (Cu) or aluminum (Al), or the like. The wiring m2 is disposed above the wiring m1. At least a part of the wiring m2 is connected to the wiring m1 via a contact c2 and the like.

Note that, a part of the plurality of wirings m2 functions as the above-described auxiliary wiring SGDA (FIG. 1). In the example in FIG. 3, the conductive layer 110 (SGD) has one end portion and the other end portion where contacts CC are disposed. Between the conductive layer 110 (SGD) and the auxiliary wiring SGDA, these two contacts CC are connected in parallel. As illustrated in FIG. 5, the auxiliary wirings SGDA are disposed corresponding to the string units SUa, SUb, SUc, SUd, SUe, and are disposed at positions overlapping them when viewed from the Z-direction. In the example in FIG. 5, the five auxiliary wirings SGDA corresponding to the string units SUa, SUb, SUc, SUd, SUe have approximately the same widths in the Y-direction.

[Write Operation]

Figure 12:
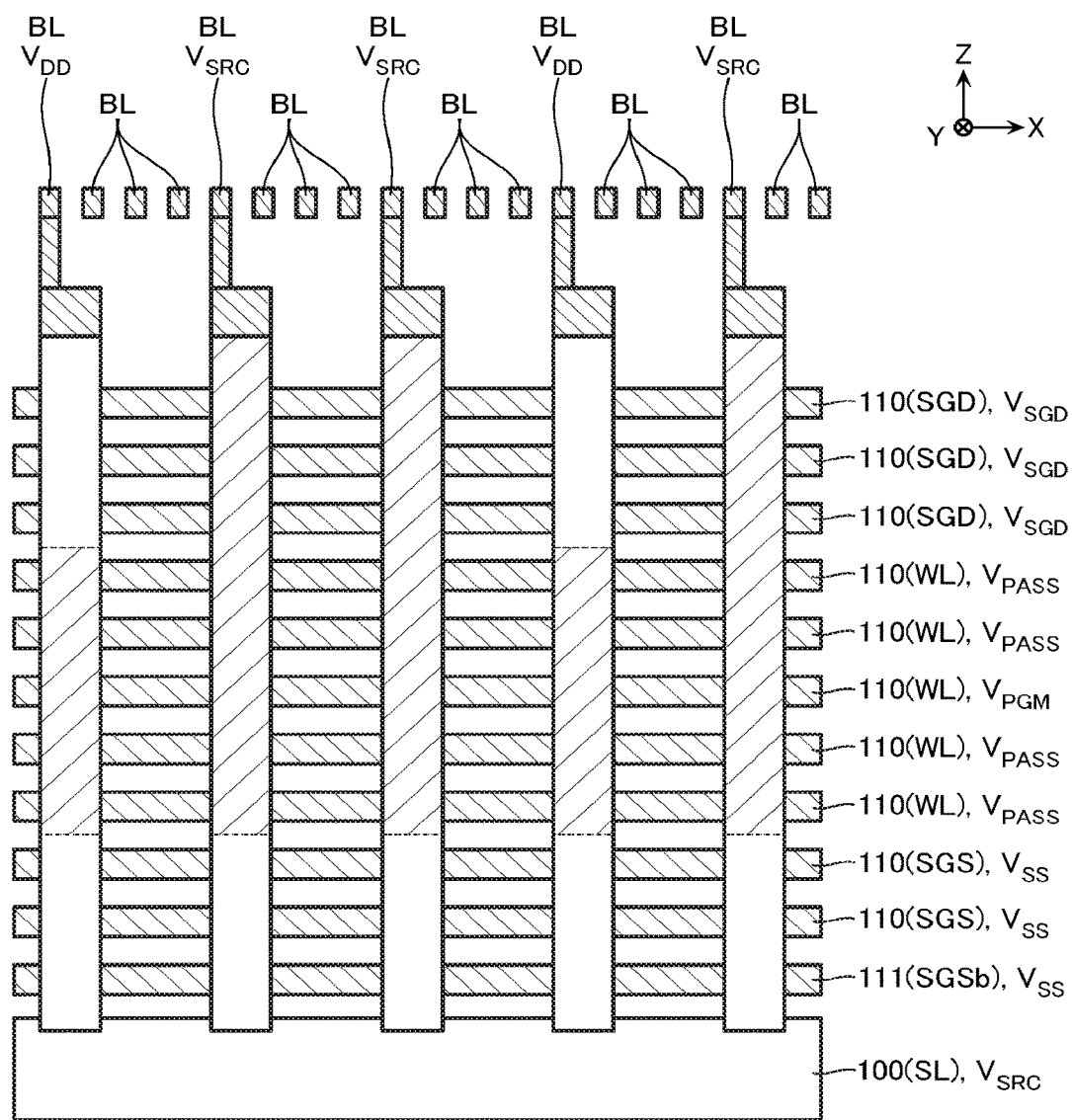
FIG. 12 is a schematic cross-sectional view for describing a write operation.
Figure 13:
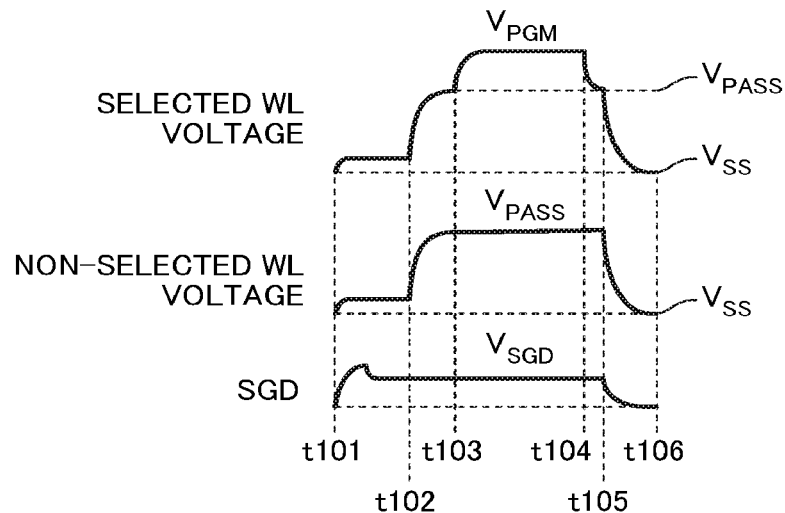
FIG. 13 is a schematic waveform diagram for describing the write operation.

Next, with reference to FIG. 12 and FIG. 13, a write operation of the semiconductor memory device will be described. FIG. 12 is a schematic cross-sectional view for describing the write operation. FIG. 13 is a schematic waveform diagram for describing the write operation.

When performing the write operation, for example, as illustrated in FIG. 12, the bit line BL connected to one whose threshold voltage is adjusted among the plurality of selected memory cells MC (hereinafter, referred to as "write memory cell MC" in some cases) is supplied with a voltage $V_{SRC}$, and the bit line BL connected to one whose threshold voltage is not adjusted among the plurality of selected memory cells MC (hereinafter, referred to as "inhibited memory cell MC" in some cases) is supplied with a voltage $V_{DD}$.

For example, as illustrated in FIG. 13, at a timing t101, the voltage $V_{SGD}$ is supplied to the drain side select gate line SGD corresponding to the selected memory cell MC. For example, as illustrated in FIG. 12, this causes the drain-side select transistor STD corresponding to the bit line BL supplied with the voltage $V_{SRC}$ to be in the ON state and causes the drain-side select transistor STD corresponding to the bit line BL supplied with the voltage $V_{DD}$ to be in the OFF state.

For example, as illustrated in FIG. 13, at a timing t102, a write pass voltage $V_{PASS}$ is supplied to the word line WL. For example, as illustrated in FIG. 12, this causes all the memory cells MC to be in the ON state.

For example, as illustrated in FIG. 13, at a timing t103, a program voltage $V_{PGM}$ is supplied to the selected word line WL. The program voltage $V_{PGM}$ is larger than the write pass voltage $V_{PASS}$.

Here, as illustrated in FIG. 12, a voltage of the channel formed in the semiconductor column 120 corresponding to the write memory cell MC is as large as the voltage $V_{SRC}$. Accordingly, a voltage as large as the program voltage $V_{PGM}$ is generated between the channel of the write memory cell MC and the selected word line WL, and the electrons in the channel are charged in the electric charge accumulating film 132 (FIG. 8) of the write memory cell MC. This increases the threshold voltage of the write memory cell MC.

On the other hand, as illustrated in FIG. 12, the channel formed in the semiconductor column 120 corresponding to the inhibited memory cell MC is electrically separated from both the bit line BL and the source line SL, and is in an electrically floating state. The voltage of this channel is as large as the write pass voltage $V_{PASS}$ due to the capacitive connecting with the word line WL. Accordingly, the voltage as large as the program voltage $V_{PGM}$ is not generated between the channel of the inhibited memory cell MC and the selected word line WL, and the electrons in the channel are not charged in the electric charge accumulating film 132 (FIG. 8) of the write memory cell MC. Accordingly, the threshold voltage of the inhibited memory cell MC is not increased.

Effect of First Embodiment

In the configuration illustrated by referring to FIG. 6 and the like, the plurality of conductive layers 110 (WL) are arranged in the Y-direction via the inter-block structures ST. The plurality of conductive layers 110 (SOD) are arranged in the Y-direction via, not only the inter-block structures ST, but also the inter-string unit insulating layers SHE and the like. Here, a height in the Z-direction of the inter-string unit insulating layer SHE is smaller than a height in the Z-direction of the inter-block structure ST. Accordingly, a width in the Y-direction of the inter-string unit insulating layer SHE can be made smaller than that of the inter-block structure ST. Accordingly, such a configuration ensures a decreased width in the Y-direction of the memory block BLK compared with a case where, for example, all the string units SU are separated by the inter-block structures ST.

Here, as described with reference to FIG. 6 and the like, in such a configuration, the end portion on one side in the Y-direction of the conductive layer 110 (SGDa) and 110 (SGDe) are formed into approximately straight lines along the inter-block structure ST extending in a straight line in the X-direction. In such a portion, the semiconductor columns 120, 120' are not disposed, and the resistance value is relatively small.

On the other hand, in such a configuration, both the ends in the Y-direction of the conductive layers 110 (SGDb), 110 (SGDc), 110 (SGDd) have periodically meandering shapes along the inter-string unit insulating layer SHE extending in the X-direction and the side surfaces of the semiconductor columns 120' periodically disposed in the X-direction. A resistance value of such a portion relatively increases in some cases.

Figure 15:
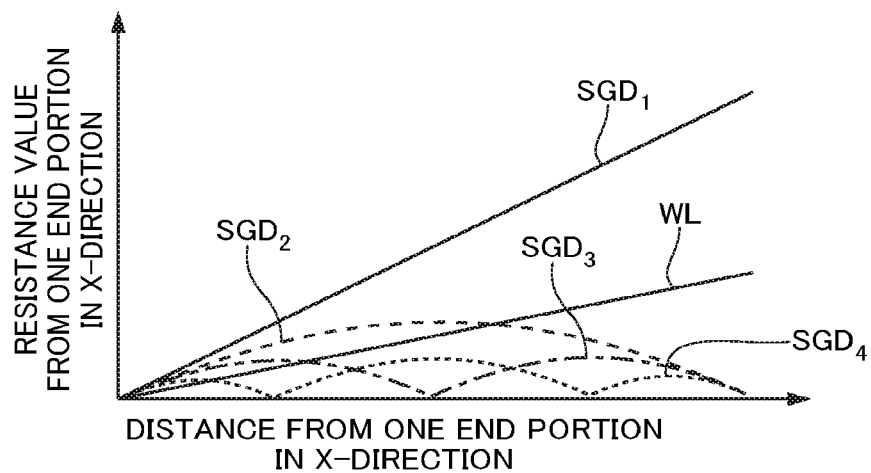

For example, FIG. 15 illustrates a relation between a distance from one end portion in the X-direction and a resistance value from the one end portion in the X-direction of the conductive layer 110. The conductive layers 110 (SGDb), 110 (SGDc), 110 (SGDd) can correspond to a characteristic indicated by $SGD_1$ in FIG. 15. In FIG. 15, a resistance value in $SGD_1$ is larger than a resistance value in the word line WL.

Here, for example, at the write operation timing t102 described with reference to FIG. 13, the write pass voltage $V_{PASS}$ is supplied to the word line WL. In this case, the voltage of the drain side select gate line SGD may be susceptible to the capacitive connecting with the word line WL.

Here, resistance values of the conductive layer 110 (SGDa) and 110 (SGDe) are smaller than resistance values of the conductive layers 110 (SGDb), 110 (SGDc), 110 (SGDd). Accordingly, for example, when the write operation is executed for any of the string units SUa, SUe, an electric charge is appropriately supplied to the drain side select gate lines SGDa, SGDe from the peripheral circuit PC even though an effect of the capacitive connecting occurs at the timing t102. Accordingly, it is relatively easy to maintain the voltage of the drain side select gate line SGDa, SGDe at the voltage $V_{SGD}$.

Figure 14:
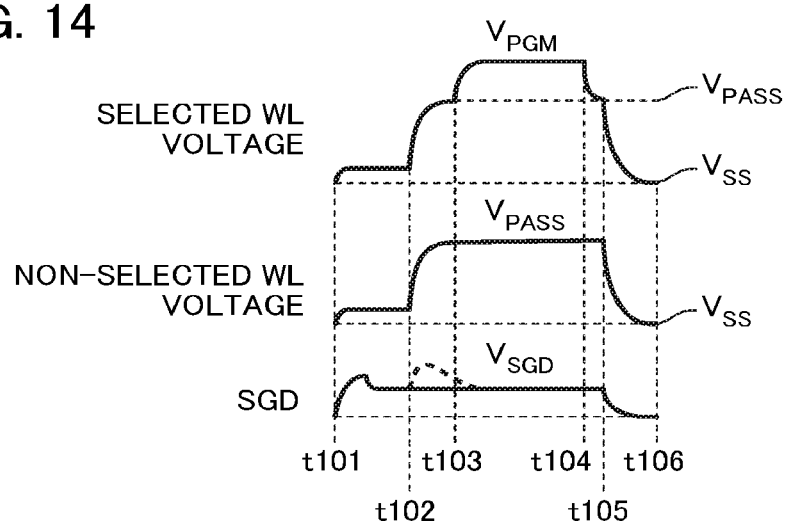
FIG. 14 is a schematic waveform diagram for describing a phenomenon that can occur during the write operation.

On the other hand, resistance values of the conductive layers 110 (SGDb), 110 (SGDc), 110 (SGDd) are relatively large. Accordingly, for example, when the write operation is executed for any of the string units SUb, SUc, Sud, there is a case where an electric charge is not appropriately supplied to the drain side select gate lines SGDb, SGDc, SGDd from the peripheral circuit PC when the effect of the capacitive connecting occurs at the timing t102. In such a case, for example, as illustrated by the dotted line in FIG. 14, there is a case where the voltage of the drain side select gate line SGDb, SGDc, SGDd temporarily exceeds the above-described voltage $V_{SGD}$ to temporarily cause the drain-side select transistor STD connected to the inhibited memory cell MC to be in the ON state. This may cause a case where the voltage of the channel of the inhibited memory cell MC is decreased to generate a relatively large voltage between the channel of the inhibited memory cell MC and the selected word line WL at the write operation timing t103, and thus, the threshold voltage of the inhibited memory cell MC is increased.

In order to reduce such a phenomenon, for example, it is possible to dispose two block select transistors 35 (FIG. 1) corresponding to the drain side select gate line SGD on one side and the other side in the X-direction of the memory cell array region $R_{MCA}$. It is also possible to connect the conductive layer 110 (SGD) to two block select transistors 35. With such a configuration, the phenomenon as described above can be reduced by supplying a voltage from the one side and the other side in the X-direction to the conductive layer 110 (SGD). However, there is a case of an increased area of the peripheral circuit area $R_{PC}$ with such a configuration.

Therefore, in this embodiment, for example, as described with reference to FIG. 3 and the like, the contacts CC are disposed at the one end portion and the other end portion in the X-direction of the conductive layer 110 (SGD). Between the conductive layer 110 (SGD) and the auxiliary wiring SGDA, these two contacts CC are connected in parallel. This ensures substantially reducing the resistance value in the drain side select gate line SGD to reduce the phenomenon as described above.

Note that the conductive layer 110 (SOD) according to the first embodiment can correspond to the characteristic indicated by $SGD_2$ in FIG. 15. In FIG. 15, the resistance value of $SGD_2$ is a local minimal value at the one end portion and the other end portion in the X-direction. This is because the contacts CC are disposed at the one end portion and the other end portion in the X-direction of the conductive layer 110 (SGD) in the first embodiment. In FIG. 15, the resistance value of $SGD_2$ is smaller than the resistance value of $SGD_1$ even at a portion located between the one end portion and the other end portion in the X-direction. This is because the two contacts CC are connected in parallel between the conductive layer 110 (SGD) and the auxiliary wiring SGDA.

Second Embodiment

Figure 16:
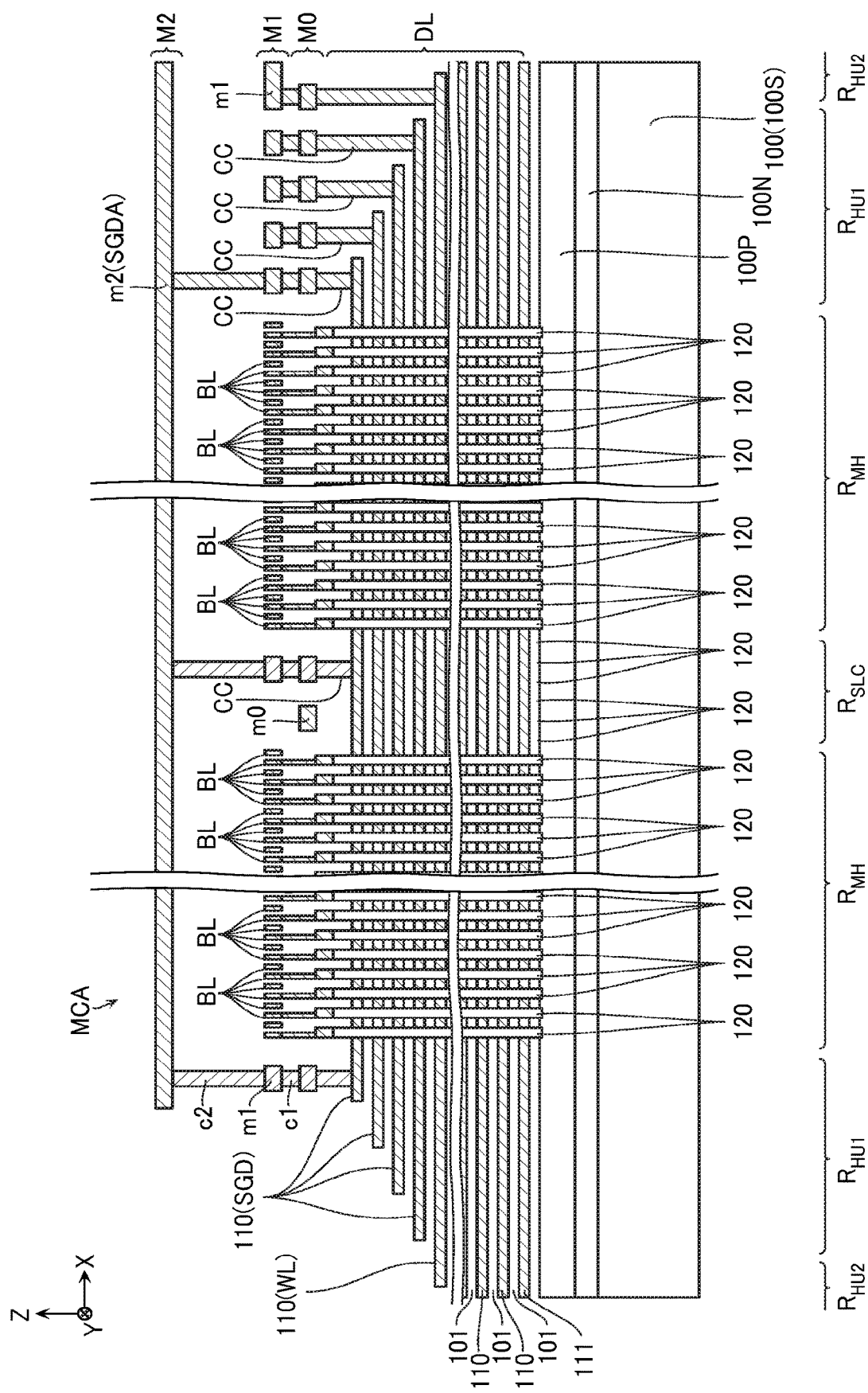
FIG. 16 is a schematic cross-sectional view illustrating a part of a configuration of a semiconductor memory device according to a second embodiment.
Figure 17:
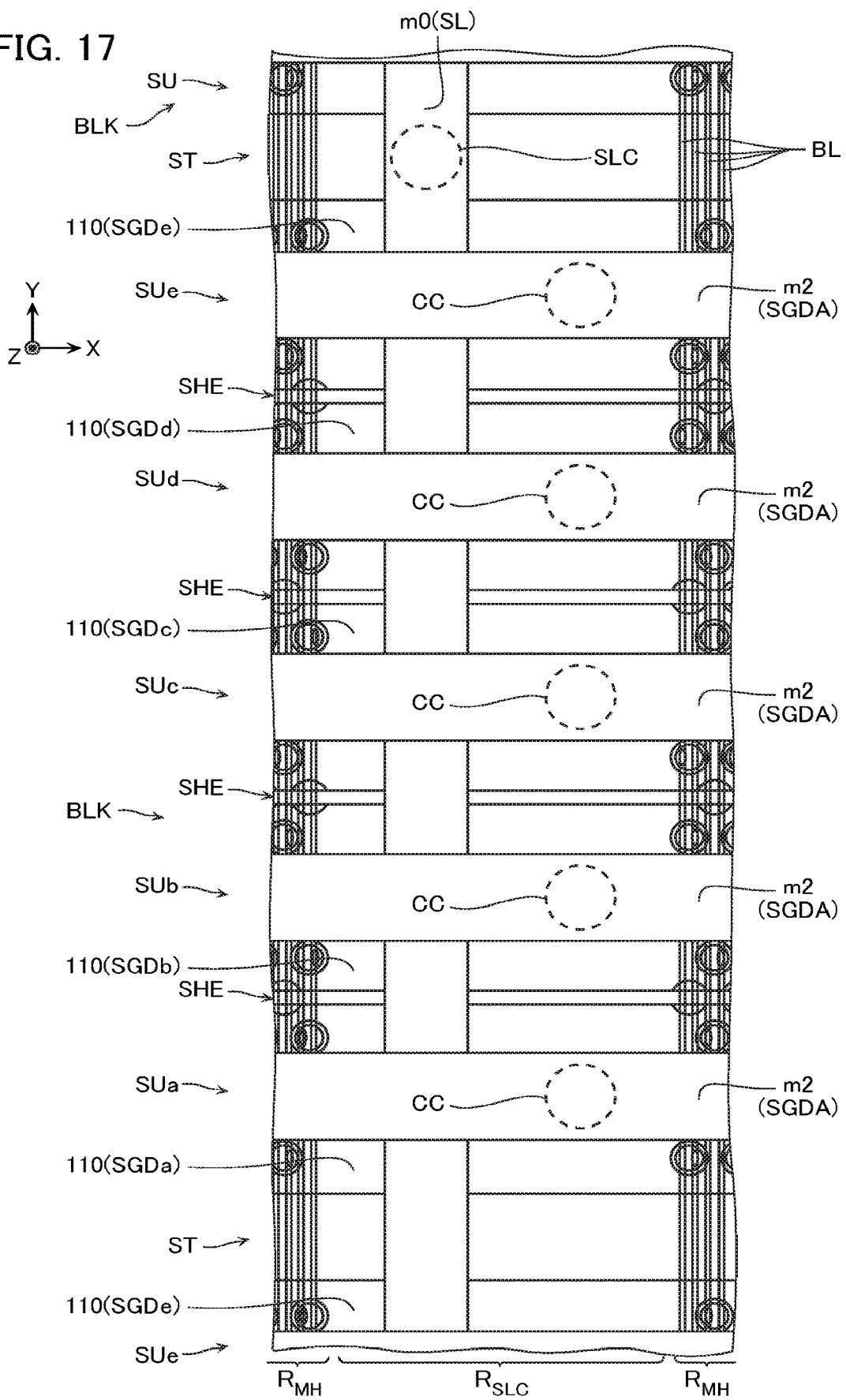
FIG. 17 is a schematic plan view illustrating a part of a configuration of the semiconductor memory device according to the second embodiment.

Next, with reference to FIG. 16 and FIG. 17, a semiconductor memory device according to a second embodiment will be described. FIG. 16 is a schematic cross-sectional view illustrating a part of a configuration of the semiconductor memory device according to the second embodiment. FIG. 17 is a schematic plan view illustrating a part of a configuration the semiconductor memory device according to the second embodiment.

The semiconductor memory device according to the second embodiment is basically configured similarly to the semiconductor memory device according to the first embodiment.

However, in the first embodiment, as described with reference to FIG. 3 and the like, the contacts CC are disposed at the one end portion and the other end portion in the X-direction of the conductive layer 110 (SGD). These two contacts CC are connected in parallel between the conductive layer 110 (SGD) and the auxiliary wiring SODA.

On the other hand, in the second embodiment, for example, as illustrated in FIG. 16, the contacts CC are disposed also at a center portion in the X-direction in addition to the one end portion and the other end portion in the X-direction of the conductive layer 110 (SGD). These three contacts CC are connected in parallel between the conductive layer 110 (SOD) and the auxiliary wiring SGDA.

In the second embodiment, as described with reference to FIG. 2, the plurality of source line contact regions $R_{SLC}$ arranged in the X-direction are disposed in the memory cell array region $R_{MCA}$. One of the plurality of these source line contact regions $R_{SLC}$ has a region without the semiconductor column 120' or the gate insulating film 130, for example, as illustrated in FIG. 17. In such a region, the contact CC is disposed. This contact CC is electrically connected between the conductive layer 110 (SGD) and the auxiliary wiring SGDA.

Such a configuration ensures further reducing the resistance value in the conductive layer 110 (SGD) to more appropriately reduce the phenomenon as described above.

For example, the conductive layer 110 (SGD) according to the second embodiment can correspond to the characteristic indicated by $SGD_3$ in FIG. 15. In FIG. 15, the resistance value of $SGD_3$ is a local minimal value at the one end portion, the other end portion, and the center portion. This is because the contacts CC are disposed at the one end portion, the other end portion, and the center portion in the X-direction of the conductive layer 110 (SGD), and these three contacts CC are connected to the common auxiliary wiring SGDA. In FIG. 15, the resistance value of $SGD_3$ is smaller than the resistance value of $SGD_2$ at a portion located between the one end portion and the center portion in the X-direction or even a portion located between the center portion and the other end portion. This is because the conductive layer 110 (SGD) and the auxiliary wiring SGDA are connected in parallel via the three contacts CC.

Note that, in the first embodiment, the two contacts CC are connected in parallel between the conductive layer 110 (SGD) and the auxiliary wiring SGDA. In the second embodiment, the three contacts CC are connected in parallel between the conductive layer 110 (SGD) and the auxiliary wiring SGDA. However, such configurations are merely examples, and the specific configuration is adjustable as necessary. For example, four or more contacts CC may be connected in parallel between the conductive layer 110 (SGD) and the auxiliary wiring SGDA. For example, when four contacts CC are connected in parallel between the conductive layer 110 (SGD) and the auxiliary wiring SGDA, the resistance value of the conductive layer 110 (SGD) can be further reduced as with the characteristic indicated by $SGD_4$ in FIG. 15.

Third Embodiment

Next, with reference to FIG. 18, a semiconductor memory device according to a third embodiment will be described.

Figure 18:
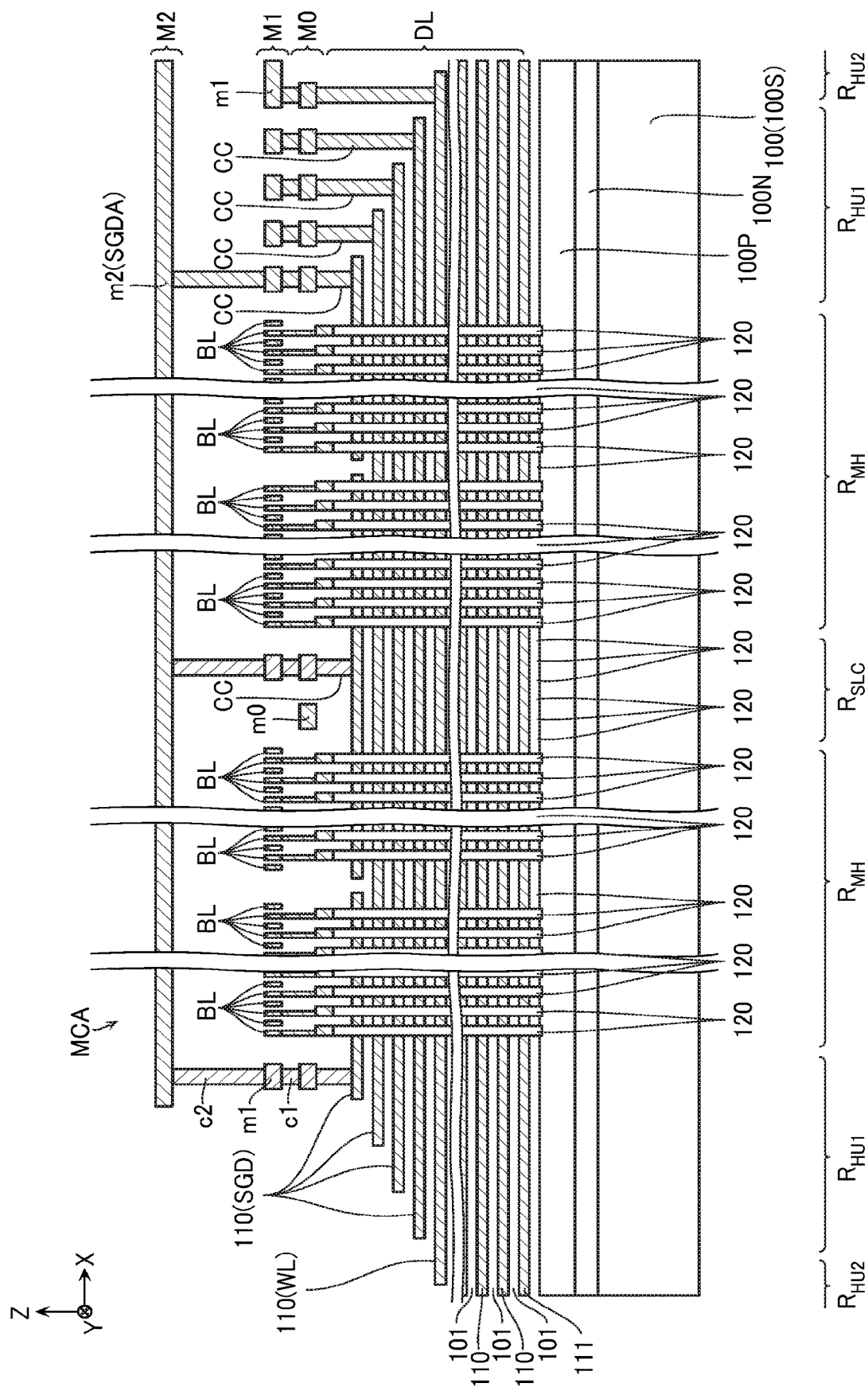
FIG. 18 is a schematic cross-sectional view illustrating a part of a configuration of a semiconductor memory device according to a third embodiment.

FIG. 18 is a schematic cross-sectional view illustrated a part of a configuration of the semiconductor memory device according to the third embodiment.

The semiconductor memory device according to the third embodiment is basically configured similarly to the semiconductor memory device according to the second embodiment.

However, for example, as illustrated in FIG. 16, in the second embodiment, the conductive layer 110 (SGD) is continuously formed over a range from the first hook-up region $R_{HU1}$ in one side (for example, the left side in FIG. 16) in the X-direction to the first hook-up region $R_{HU1}$ in the other side (for example, the right side in FIG. 16). Between such conductive layer 110 and auxiliary wiring SGDA, the three contacts CC are connected in parallel.

On the other hand, for example, as illustrated in FIG. 18, in the third embodiment, parts of the conductive layer 110 (SGD) are separated into a plurality of portions in the X-direction. For example, in the example in FIG. 18, three conductive layers 110 (SGD) arranged in the X-direction are disposed on the upper side of the plurality of conductive layers 110.

One disposed in one side (for example, the left side in FIG. 18) in the X-direction of the three conductive layers 110 (SGD) extends in the X-direction and is opposed to an outer peripheral surface of the semiconductor column 120 in the plurality of memory hole regions $R_{MH}$. It is also connected to the contact CC disposed in the first hook-up region $R_{HU1}$ in the one side in the X-direction, and is connected to the auxiliary wiring SGDA via this contact CC.

One disposed in the other side (for example, the right side in FIG. 18) in the X-direction of the three conductive layers 110 (SGD) extends in the X-direction and is opposed to the outer peripheral surface of the semiconductor column 120 in the plurality of memory hole regions $R_{MH}$. It is also connected to the contact CC disposed in the first hook-up region $R_{HU1}$ in the other side in the X-direction, and is connected to the auxiliary wiring SGDA via this contact CC.

The conductive layer 110 disposed between these two conductive layers 110 (SGD) extends in the X-direction and is opposed to the outer peripheral surface of the semiconductor column 120 in the plurality of memory hole regions $R_{MH}$. It is also connected to the contact CC disposed in the source line contact region $R_{SLC}$ disposed adjacent to the center of the memory cell array region $R_{MCA}$, and is connected to the auxiliary wiring SGDA via this contact CC.

Such a configuration ensures disposing the contacts CC at the proximity of the plurality of semiconductor columns 120. Accordingly, it is possible to reduce the resistance value in the drain side select gate line SGD to reduce the phenomenon as described above.

Fourth Embodiment

Figure 19:
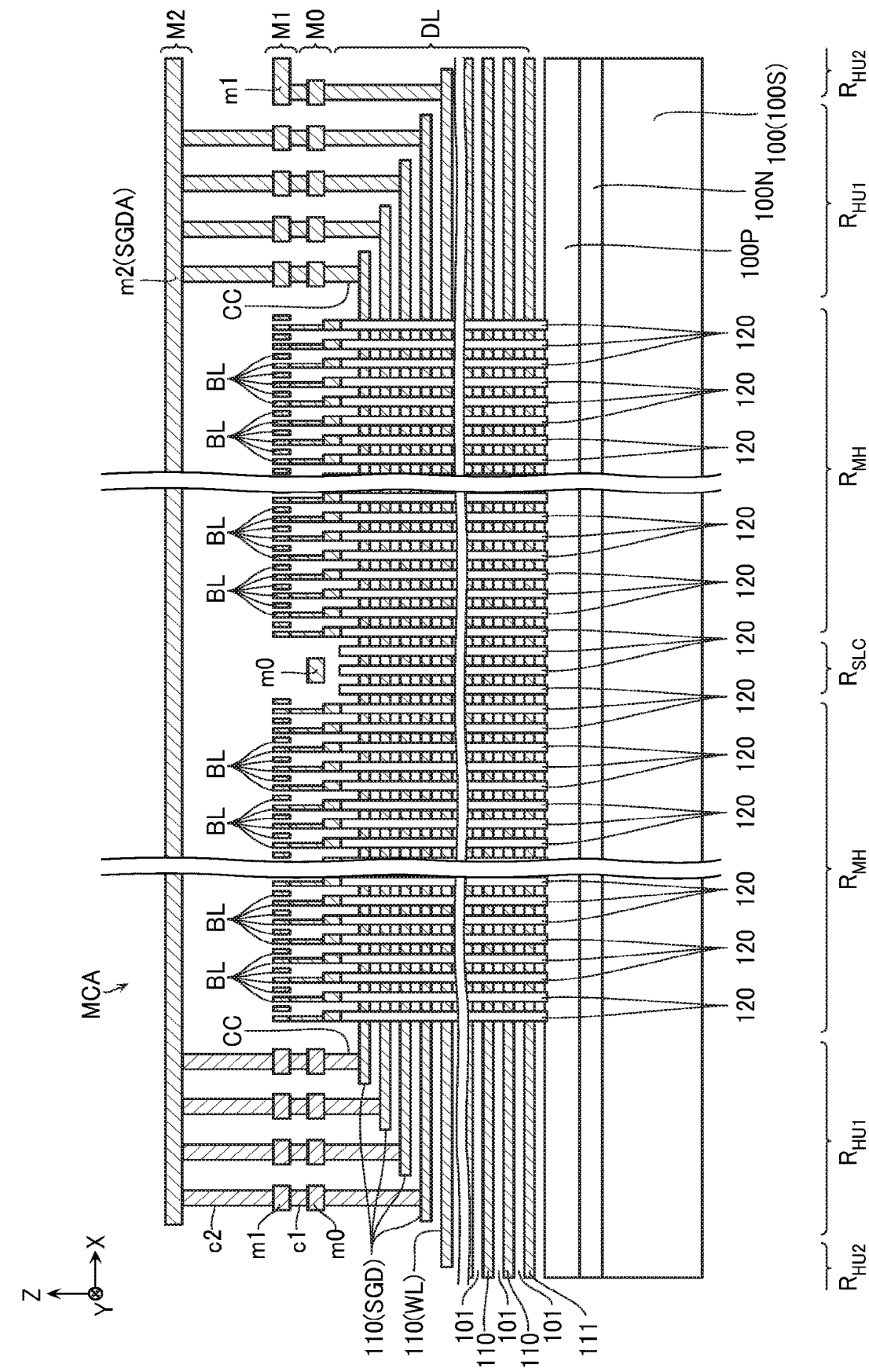
FIG. 19 is a schematic cross-sectional view illustrating a part of a configuration of a semiconductor memory device according to a fourth embodiment.

Next, with reference to FIG. 19, a semiconductor memory device according to a fourth embodiment will be described. FIG. 19 is a schematic cross-sectional view illustrating a part of a configuration of the semiconductor memory device according to the fourth embodiment.

The semiconductor memory device according to the fourth embodiment is basically configured similarly to the semiconductor memory device according to the first embodiment.

However, in the first embodiment, as described with reference to FIG. 3 and the like, only one conductive layer 110 located on the uppermost layer among the plurality of conductive layers 110 arranged in the Z-direction is connected to the auxiliary wiring SGDA.

On the other hand, in the fourth embodiment, for example, as illustrated in FIG. 19, all the conductive layers 110 (SGD) arranged in the Z-direction are connected to the auxiliary wiring SGDA.

That is, in the fourth embodiment, for example, as illustrated in FIG. 19, the respective contacts CC are disposed at an end portion in one side (for example, the left side in FIG. 19) and an end portion in the other side (for example, the right side in FIG. 19) in the X-direction of the four conductive layers 110 (SGD). Two contacts CC each are connected in parallel between the conductive layer 110 (SGD) and the auxiliary wiring SGDA. That is, in the example in FIG. 19, one auxiliary wiring SGDA is connected to the four conductive layer 110 (SGD) via eight contacts CC.

Fifth Embodiment

Figure 20:
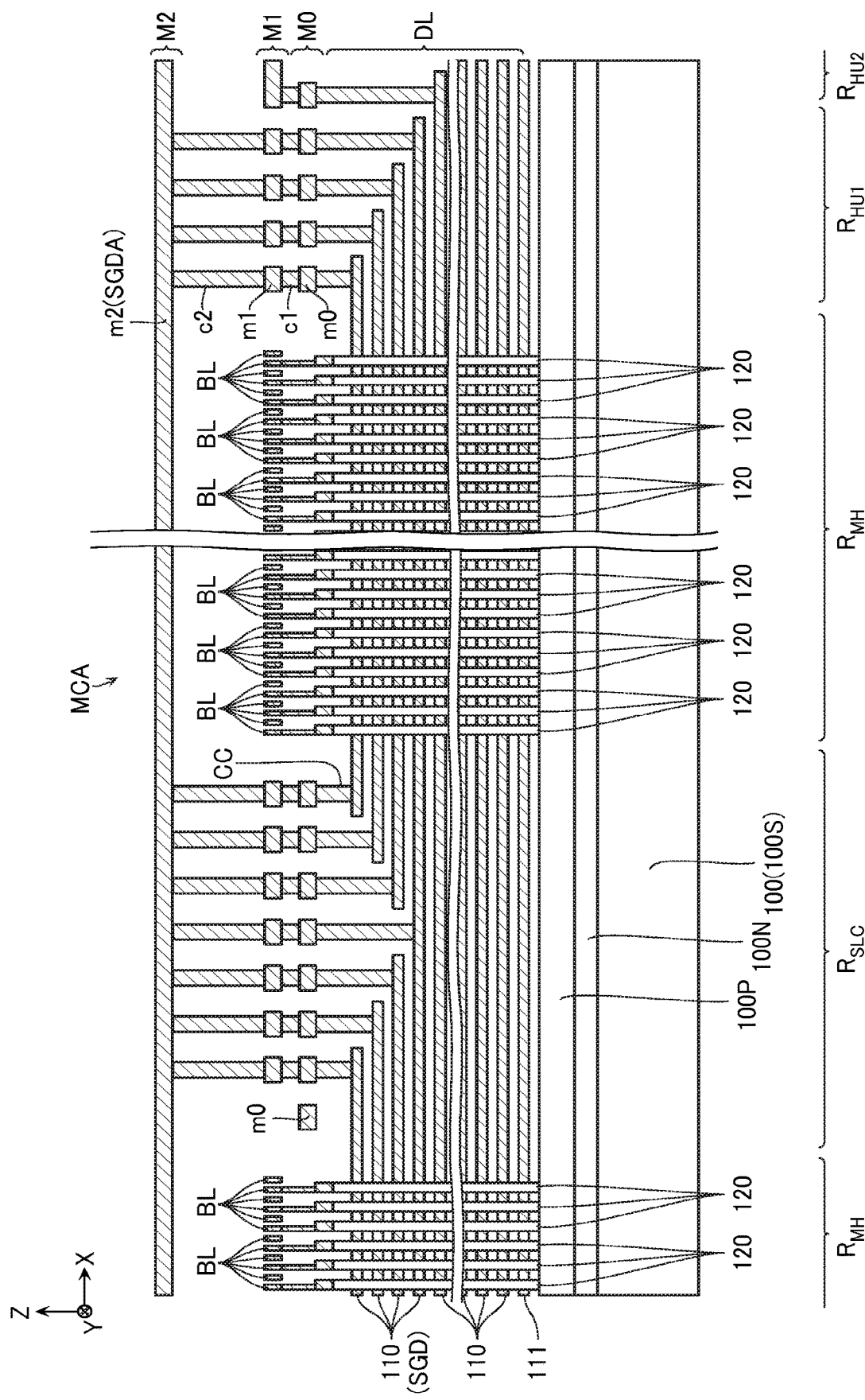
FIG. 20 is a schematic cross-sectional view illustrating a part of a configuration of a semiconductor memory device according to a fifth embodiment.
Figure 21:
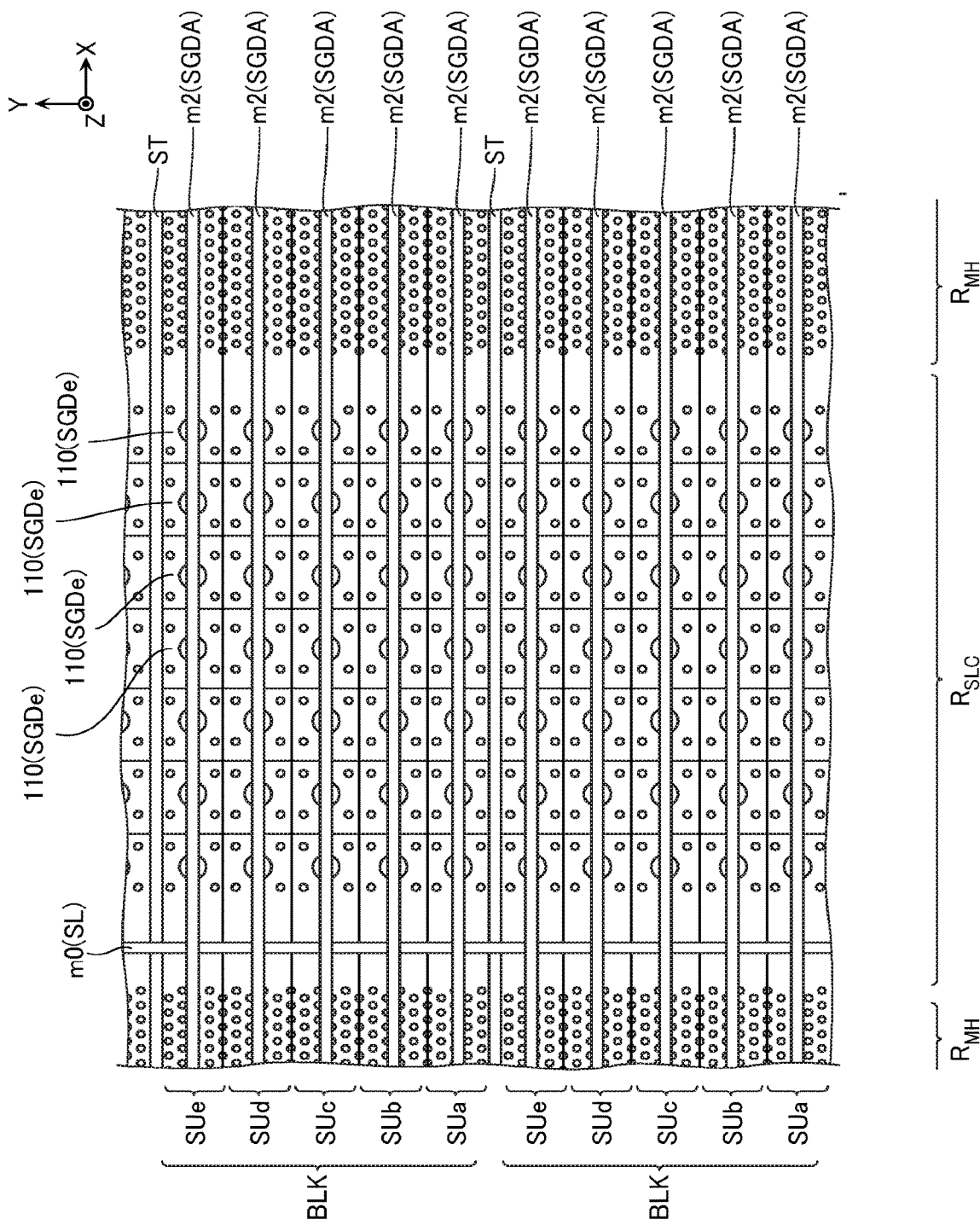
FIG. 21 is a schematic plan view illustrating a part of the configuration of the semiconductor memory device according to the fifth embodiment.

Next, with reference to FIG. 20 and FIG. 21, a semiconductor memory device according to a fifth embodiment will described. FIG. 20 is a schematic cross-sectional view illustrating a part of a configuration of the semiconductor memory device according to the fifth embodiment. FIG. 21 is a schematic plan view illustrating a part of the configuration of the semiconductor memory device according to the fifth embodiment.

The semiconductor memory device according to the fifth embodiment is basically configured similarly to the semiconductor memory device according to the fourth embodiment.

However, in the fourth embodiment, the conductive layer 110 (SGD) is continuously formed over the range from the first hook-up region $R_{HU1}$ in the one side in the X-direction to the first hook-up region $R_{HU1}$ in the other side in the X-direction. As described with reference to FIG. 19 and the like, the plurality of contacts CC are each disposed in the first hook-up region $R_{HU1}$ in the one side and the other side in the X-direction.

On the other hand, in the fifth embodiment, for example, as illustrated in FIG. 20 and FIG. 21, parts of the conductive layer 110 (SGD) are separated into a plurality of portions in the X-direction. The plurality of contacts CC are each disposed in one or a plurality of the source line contact regions $R_{SLC}$ in addition to the first hook-up region $R_{HU1}$ in the one side and the other side in the X-direction.

For example, as illustrated in FIG. 20, in a predetermined source line contact region $R_{SLC}$, connecting portions with the contact CC of the plurality of conductive layers 110 (SGD) are disposed. For example, in the illustrated example, end portions in the X-direction of the plurality of conductive layers 110 are disposed in the predetermined source line contact region $R_{SLC}$. The plurality of these conductive layers 110 are continuously formed over a range from the illustrated source line contact region $R_{SLC}$ to another source line contact region $R_{SLC}$ or the first hook-up region $R_{HU1}$. This source line contact region $R_{SLC}$ includes the plurality of contacts CC. The plurality of these contacts CC extend in the Z-direction and are connected to the plurality of conductive layers 110 (SGD) at lower ends. The plurality of conductive layers 110 corresponding to one drain side select gate line SGD are all connected commonly to one auxiliary wiring SGDA.

As illustrated in FIG. 21, the end portions in the X-direction of the plurality of conductive layers 110 (SGD) are arranged in a matrix viewing from the Z-direction. The contacts CC are disposed corresponding to these end portions and are connected to the plurality of conductive layers 110 (SGD). In the example in FIG. 21, the plurality of contacts CC arranged in the X-direction are all connected to the conductive layer 110 (SGD) corresponding to the same string unit SU. The plurality of contacts CC arranged in the Y-direction are all connected to the conductive layer 110 (SGD) corresponding to the different string units SU.

The predetermined source line contact region $R_{SLC}$ have the supporting structures HR disposed at the proximity of the contact CC.

Figure 22:
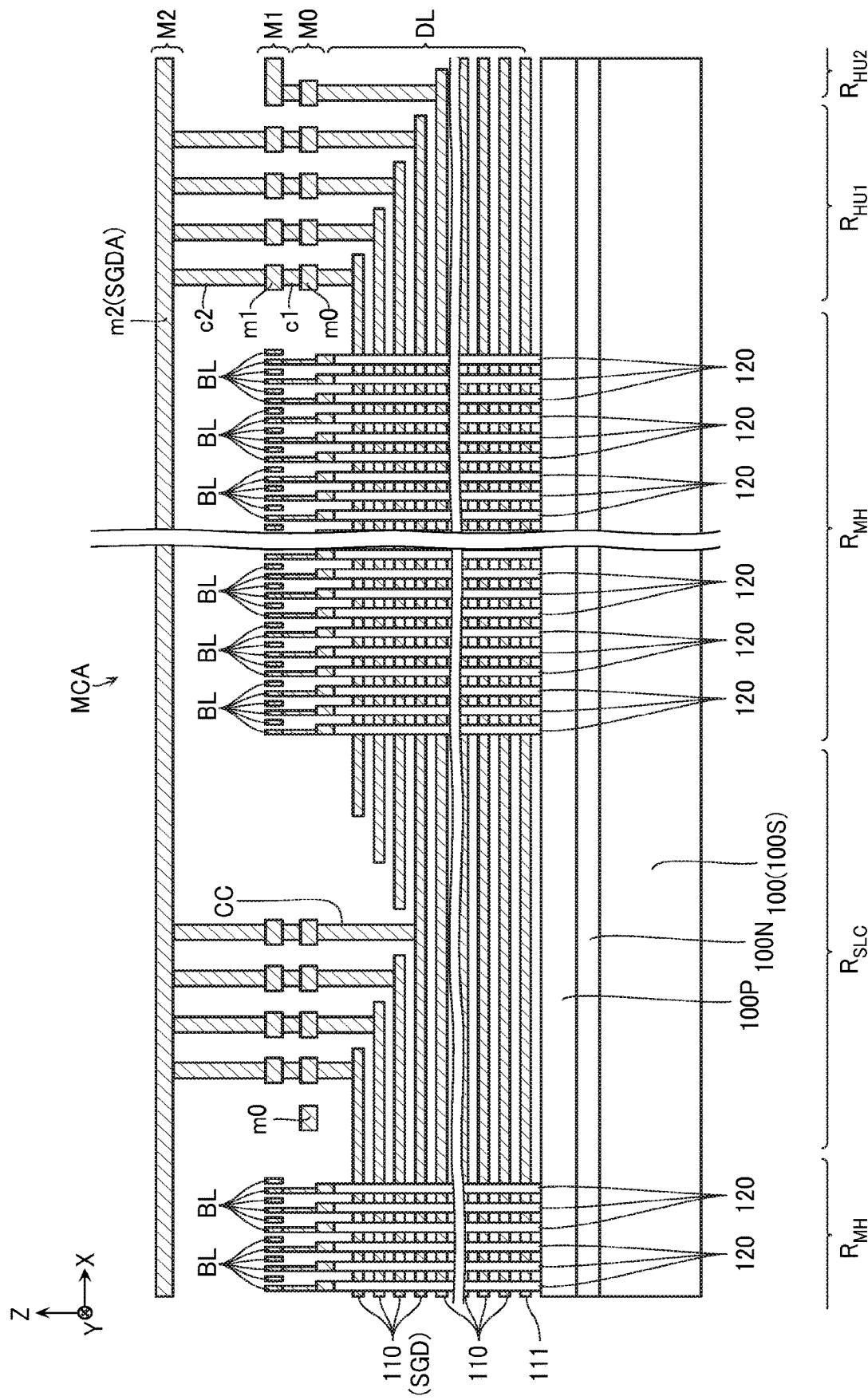
FIG. 22 is a schematic cross-sectional view illustrating another exemplary configuration of the semiconductor memory device according to the fifth embodiment.

Note that, in the example in FIG. 20 and FIG. 21, two contacts CC each are disposed corresponding to one conductive layer 110 (SGD). However, such a configuration is merely an example, and the specific configuration is adjustable as necessary. For example, as illustrated in FIG. 22, one contact CC each may be disposed corresponding to one conductive layer 110 (SGD).

Sixth Embodiment

Figure 23:
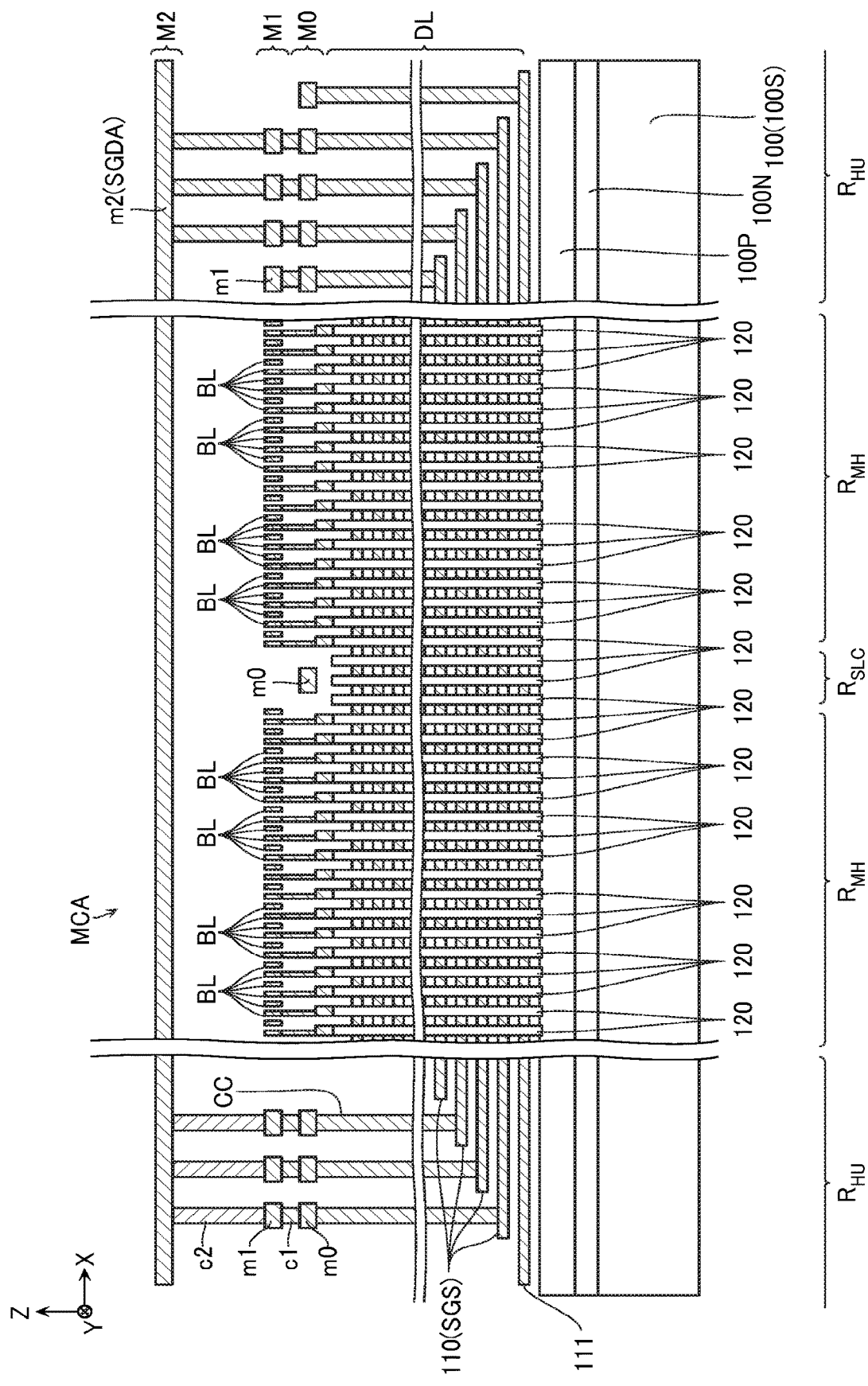
FIG. 23 is a schematic cross-sectional view illustrating a part of a configuration of a semiconductor memory device according to a sixth embodiment.

Next, with reference to FIG. 23, a semiconductor memory device according to a sixth embodiment will be described. FIG. 23 is a schematic cross-sectional view illustrating a part of a configuration of the semiconductor memory device according to the sixth embodiment.

The semiconductor memory device according to the sixth embodiment is basically configured similarly to the semiconductor memory device according to the first embodiment.

However, in the first embodiment, as described with reference to FIG. 3 and the like, the auxiliary wiring SGDA is connected to the conductive layer 110 (SGD).

On the other hand, in the sixth embodiment, for example, as illustrated in FIG. 23, the auxiliary wiring SGDA is connected to the conductive layers 110 (SGS).

Note that, in the example in FIG. 23, the auxiliary wiring SGDA is connected to one end portions and the other end portions of all the conductive layers 110 (SGS). However, such a configuration is merely an example, and the specific configuration is adjustable as necessary. For example, the auxiliary wiring SGDA may be connected to one end portion and the other end portion of only one of the plurality of conductive layers 110 (SGS). The auxiliary wiring SGDA may be connected to the conductive layer 110 (SGS) via three or more contacts CC.

Seventh Embodiment

Figure 24:
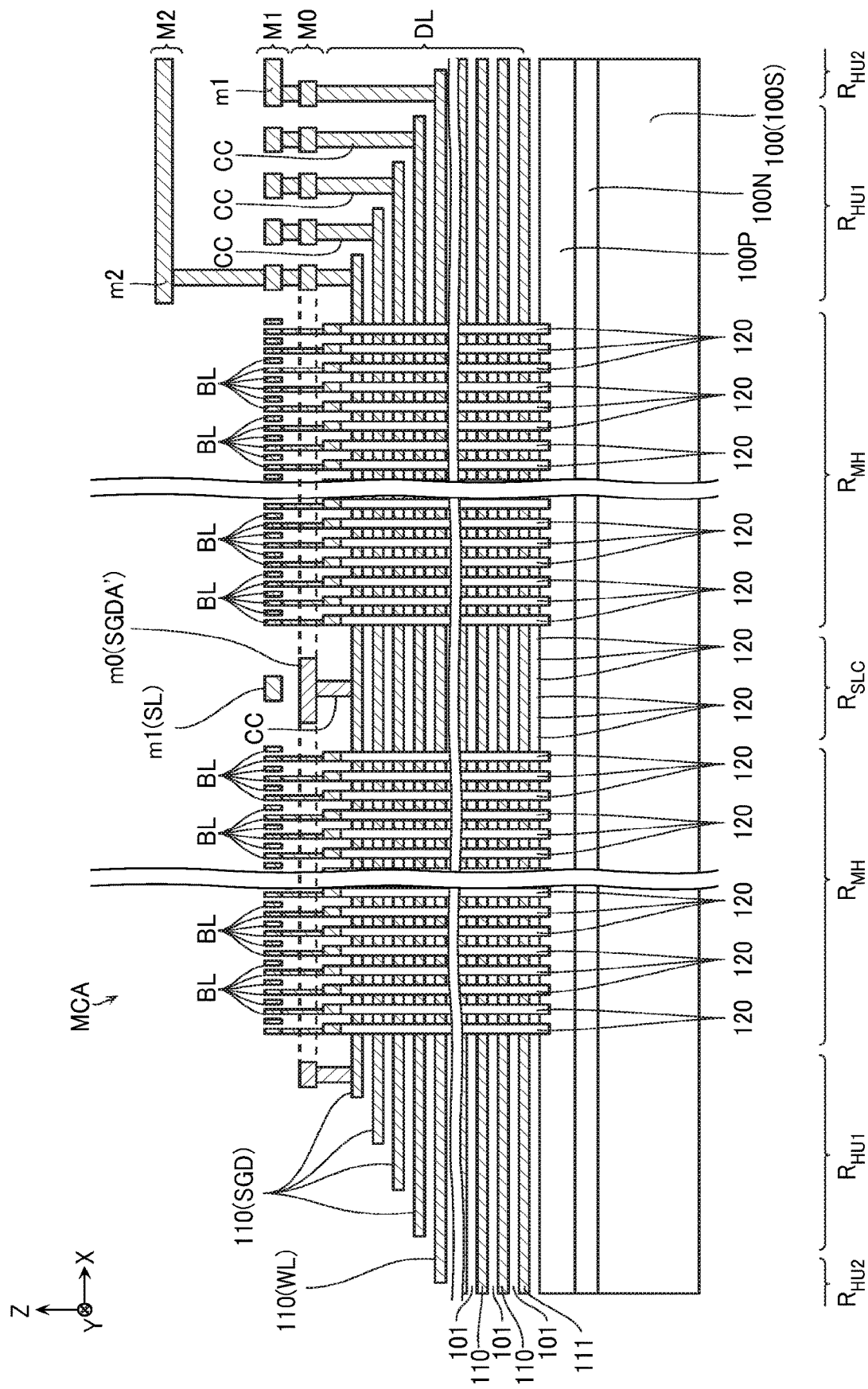
FIG. 24 is a schematic cross-sectional view illustrating a part of a configuration of a semiconductor memory device according to a seventh embodiment.
Figure 25:
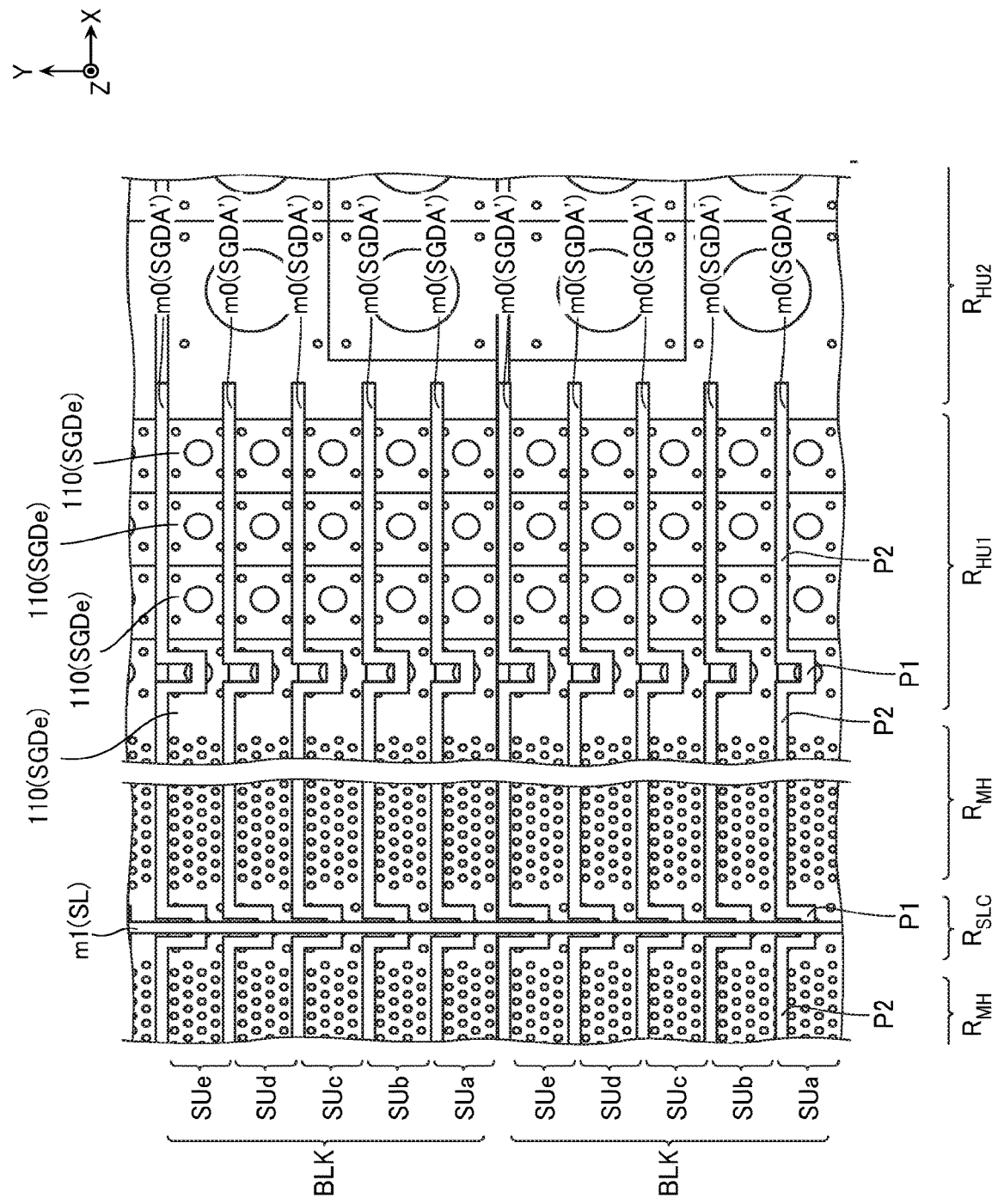
FIG. 25 is a schematic plan view illustrating a part of the configuration of the semiconductor memory device according to the seventh embodiment.
Figure 26:
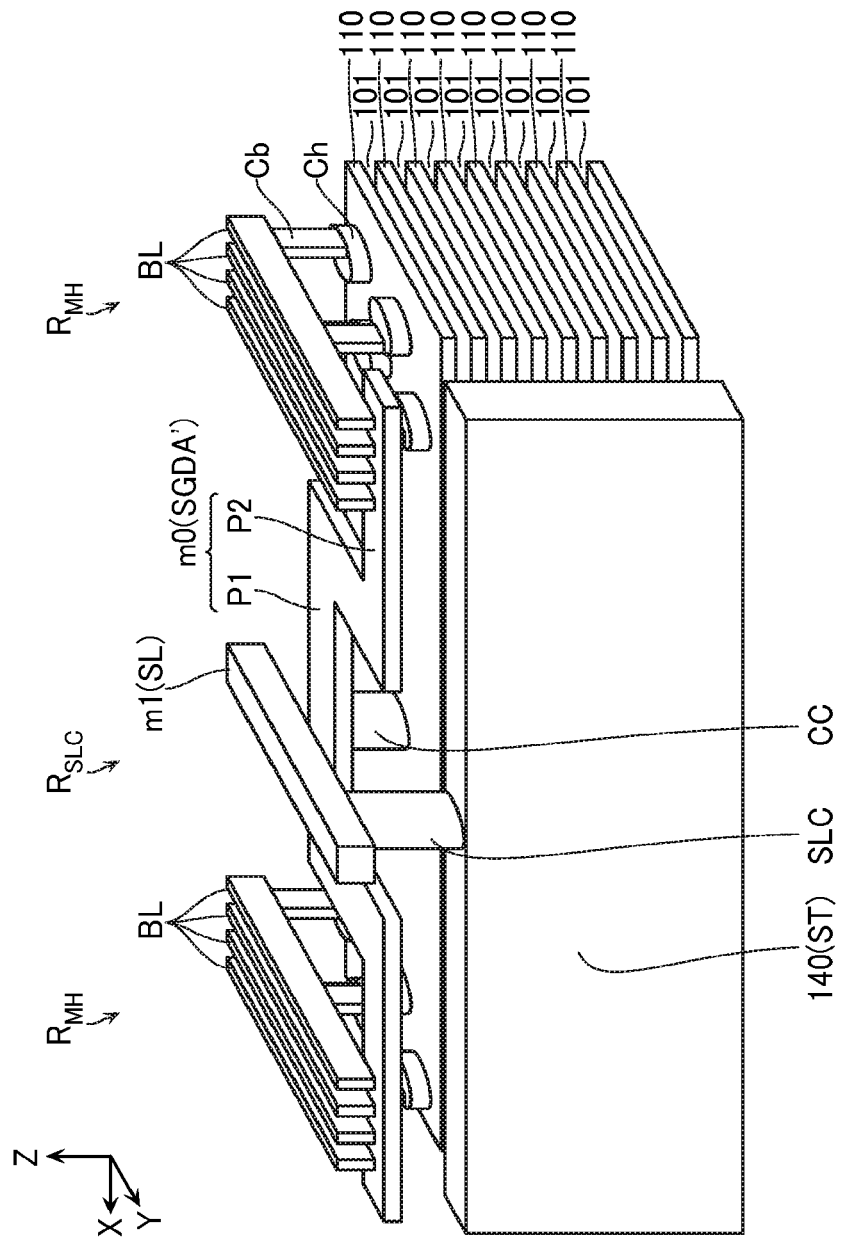
FIG. 26 is a schematic perspective view illustrating a part of the configuration of the semiconductor memory device according to the seventh embodiment.

Next, with reference to FIG. 24 to FIG. 26, a semiconductor memory device according to a seventh embodiment will be described. FIG. 24 is a schematic cross-sectional view illustrating a part of a configuration of the semiconductor memory device according to the seventh embodiment. FIG. 25 is a schematic plan view illustrating a part of the configuration of the semiconductor memory device according to the seventh embodiment. FIG. 26 is a schematic perspective view illustrating a part of a configuration of the semiconductor memory device according to the seventh embodiment.

The semiconductor memory device according to the seventh embodiment is basically configured similarly to the semiconductor memory device according to the first embodiment.

However, the auxiliary wiring SGDA according to the first embodiment, as described with reference to FIG. 3 and the like, is achieved using the wiring m2 included in the wiring layer M2 and disposed above the bit lines BL.

On the other hand, an auxiliary wiring SGDA' according to the seventh embodiment, for example, as illustrated in FIG. 24, is achieved using the wiring m0 included in the wiring layer M0 and disposed below the bit lines BL.

For example, as illustrated in FIG. 25, the auxiliary wirings SGDA' according to the embodiment are disposed corresponding to the string units SUa, SUb, SUc, SUd, SUe. The auxiliary wiring SGDA' includes a plurality of first parts P1 disposed corresponding to the plurality of contacts CC and a plurality of second parts P2 connected to the plurality of these first parts P1.

The first part P1 is, for example, disposed in a region where the contact CC is disposed, such as the first hook-up region $R_{HU1}$ and the source line contact region $R_{SLC}$, and connected to the contact CC. As illustrated in FIG. 26, the first part P1 is disposed at a location overlapping the conductive layers 110 viewing from the Z-direction. Note that, in the source line contact region $R_{SLC}$, the source line contact SLC that connects the conductive layer 140 in the inter-block structure ST to the wiring m1 functioning as a part of the source line SL is disposed. As illustrated in FIG. 26, the first part P1 is disposed to avoid this source line contact SLC.

The second part P2 extends in the X-direction along the inter-block structure ST or the inter-string unit insulating layer SHE. The second part P2 is disposed at a location overlapping the inter-block structure ST or the inter-string unit insulating layer SHE viewing from the Z-direction. Note that, in the memory hole region $R_{MH}$, contacts Ch and Cb that connect the semiconductor columns 120 to the bit lines BL are disposed. As illustrated in FIG. 26, the second part P2 is disposed to avoid the contacts Ch and Cb.

Note that, in the example in FIG. 24, the contacts CC are disposed in the one end portions, the other end portions, and the center portions of the conductive layer 110 (SGD). These three contacts CC are connected in parallel between the conductive layer 110 (SGD) and the auxiliary wiring SGDA. However, such a configuration is merely an example, and the specific configuration is adjustable as necessary. For example, the contacts CC may be disposed only in the one end portions and the other end portions in the X-direction of the conductive layers 110 (SGD). Four or more contacts CC may be disposed corresponding to one conductive layer 110 (SGD).

In the example in FIG. 24, the conductive layer 110 (SGD) is continuously formed over the range from the first hook-up region $R_{HU1}$ in the one side in the X-direction (for example, the left side in FIG. 24) to the first hook-up region $R_{HU1}$ in the other side (for example, the right side in FIG. 24) in the X-direction. Three contacts CC are connected in parallel between such conductive layer 110 and auxiliary wiring SGDA'. However, such a configuration is merely an example, and the specific configuration is adjustable as necessary. For example, one or the plurality of conductive layers 110 (SGD) may be separated into a plurality of portions in the X-direction.

In the example in FIG. 24, only one conductive layer 110 located on the uppermost layer among the plurality of conductive layers 110 arranged in the Z-direction is connected to the auxiliary wiring SGDA. However, such a configuration is merely an example, and the specific configuration is adjustable as necessary. For example, all the conductive layers 110 (SGD) arranged in the Z-direction may be connected to the auxiliary wiring SGDA'. In such a case, the contacts CC may be disposed only in the first hook-up region $R_{HU1}$ disposed in the one end portion and the other end portion in the X-direction, or the contacts CC may be disposed in one or the plurality of source line contact regions $R_{SLC}$.

In the example in FIG. 24, the auxiliary wiring SGDA' is connected to the conductive layers 110 (SGD). However, such a configuration is merely an example, and the specific configuration is adjustable as necessary. For example, the auxiliary wiring SGDA' may be connected to one or the plurality of conductive layers 110 (SGS).

Eighth Embodiment

Figure 27:
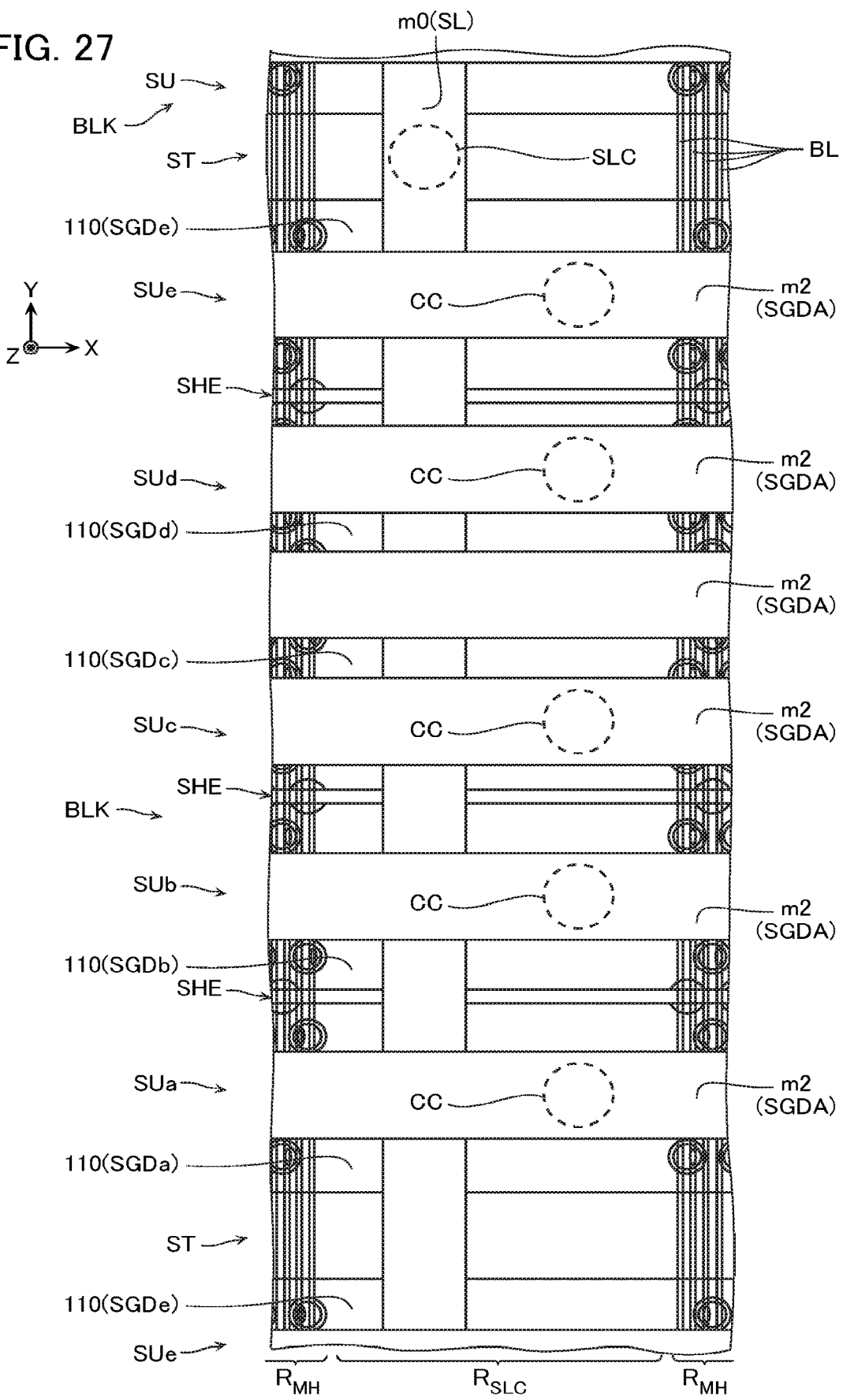
FIG. 27 is a schematic cross-sectional view illustrating a part of a configuration of a semiconductor memory device according to an eighth embodiment.

Next, with reference to FIG. 27, a semiconductor memory device according to an eighth embodiment will be described. FIG. 27 is a schematic cross-sectional view illustrating a part of a configuration of the semiconductor memory device according to the eighth embodiment.

The semiconductor memory device according to the eighth embodiment is basically configured similarly to the semiconductor memory device according to the second embodiment.

However, in the second embodiment, as illustrated in FIG. 17, five auxiliary wirings SODA are disposed corresponding to the conductive layers 110 (SGDa), 110 (SGDb), 110 (SGDc), 110 (SGDd), 110 (SGDe) corresponding to one memory block BLK. These five auxiliary wirings SGDA are each connected to the conductive layer 110 (SGD).

On the other hand, in the eighth embodiment, for example, as illustrated in FIG. 27, five auxiliary wirings SGDA corresponding to the conductive layers 110 (SGDa), 110 (SGDb), 110 (SGDc), 110 (SGDd), 110 (SGDe) and another auxiliary wiring SGDA corresponding to the conductive layer 110 (SGS) are disposed corresponding to one memory block BLK.

Note that FIG. 27 illustrates the example where both the drain side select gate line SGD and the source side select gate line SGS are connected to the auxiliary wiring SGDA in the configuration similar to that of the second embodiment. However, such a configuration is merely an example, and the specific configuration is adjustable as necessary. For example, in the first embodiment or the third embodiment to the fifth embodiment, both the drain side select gate line SGD and the source side select gate line SGS may be connected to the auxiliary wiring SGDA. For example, in the seventh embodiment, both the drain side select gate line SGD and the source side select gate line SGS may be connected to the auxiliary wiring SGDA'.

Ninth Embodiment

Figure 28:
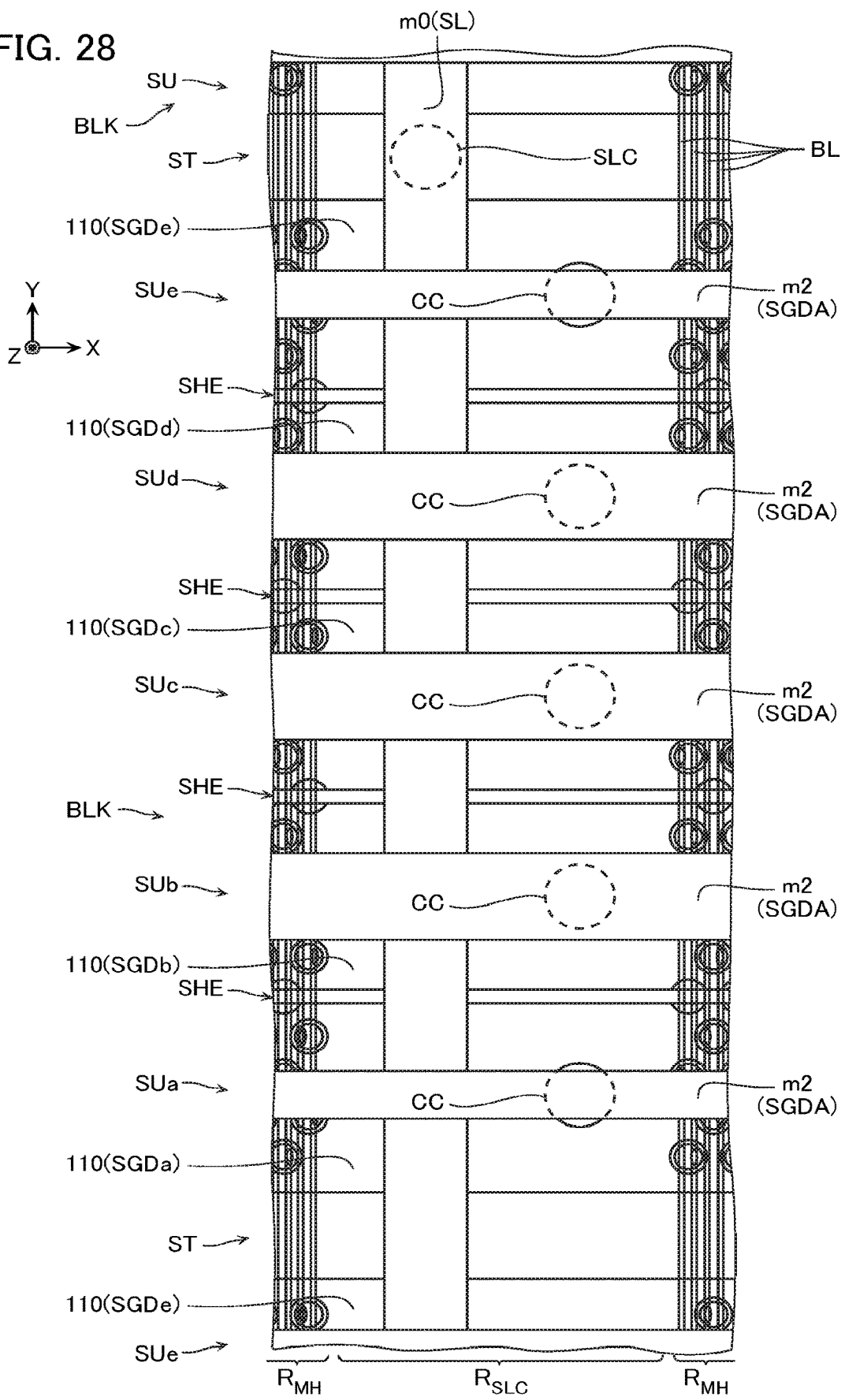
FIG. 28 is a schematic cross-sectional view illustrating a part of a configuration of a semiconductor memory device according to a ninth embodiment.

Next, with reference to FIG. 28, a semiconductor memory device according to a ninth embodiment will be described. FIG. 28 is a schematic cross-sectional view illustrating a part of a configuration of the semiconductor memory device according to the ninth embodiment.

The semiconductor memory device according to the ninth embodiment is basically configured similarly to the semiconductor memory device according to the second embodiment.

However, in the second embodiment, as illustrated in FIG. 17, five auxiliary wirings SGDA corresponding to the conductive layers 110 (SGDa), 110 (SGDb), 110 (SGDc), 110 (SGDd), 110 (SGDe) have similar widths in the Y-direction.

On the other hand, in the ninth embodiment, for example, as illustrated in FIG. 28, two auxiliary wirings SGDA corresponding to the conductive layers 110 (SGDa) and 110 (SGDe) have widths smaller than widths in the Y-direction of three auxiliary wirings SGDA corresponding to the conductive layers 110 (SGDb), 110 (SGDc), 110 (SGDd).

Here, as described above, the resistance values of the conductive layers 110 (SGDa) and 110 (SGDe) are smaller than those of the conductive layers 110 (SGDb), 110 (SGDc), 110 (SGDd). Accordingly, even though the resistance value of the auxiliary wiring SGDA connected to the conductive layers 110 (SGDa) and 110 (SGDe) is larger than the resistance value of the auxiliary wiring SGDA connected to the conductive layers 110 (SGDb), 110 (SGDc), 110 (SGDd), there is a case where the problem as described above can be sufficiently solved. This ensures achieving the integration of the wiring layer.

Figure 29:
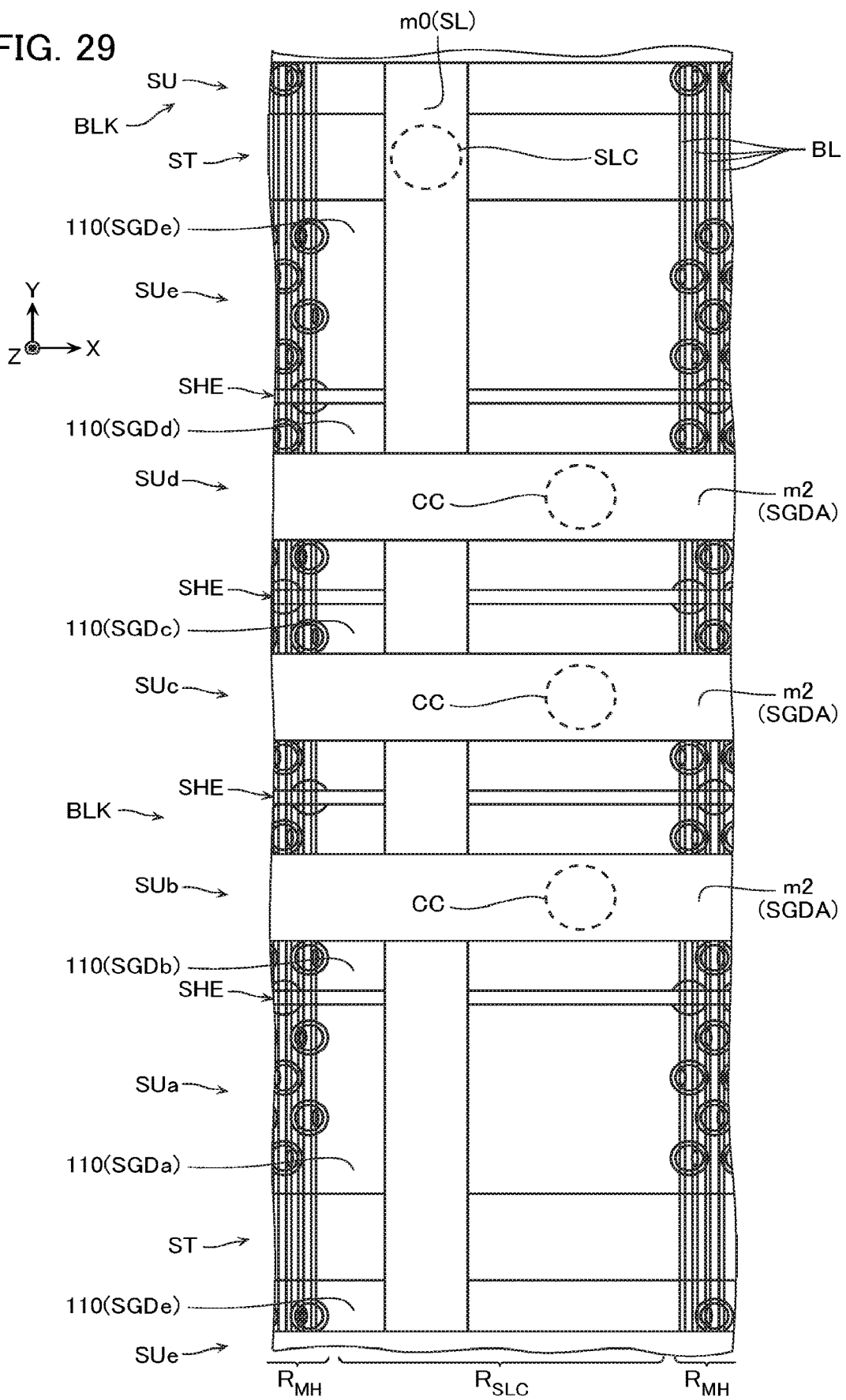
FIG. 29 is a schematic cross-sectional view illustrating another exemplary configuration of the semiconductor memory device according to the ninth embodiment.

Note that, when the resistance values of the conductive layers 110 (SGDa) and 110 (SGDe) are sufficiently small, for example, as illustrated in FIG. 29, only three auxiliary wirings SGDA corresponding to the conductive layers 110 (SGDb), 110 (SGDc), 110 (SGDd) may be disposed to omit two auxiliary wirings SGDA corresponding to the conductive layers 110 (SGDa) and 110 (SGDe). In this case, a number of contacts CC connected to the conductive layer 110 (SGDa), and, a number of contacts CC connected to the conductive layer 110 (SGDe) may be less than a number of contacts connected to the conductive layer 110 (SGDb), 110 (SGDc) or 110 (SGDd).

Note that, FIG. 28 and FIG. 29 illustrate the example where the widths in the Y-direction of two auxiliary wirings SGDA corresponding to the conductive layers 110 (SGDa) and 110 (SGDe) are decreased or such auxiliary wirings SGDA are omitted from the configuration similar to that of the second embodiment. However, such a configuration is merely an example, and the specific configuration is adjustable as necessary. For example, the widths in the Y-direction of two auxiliary wirings SGDA corresponding to the conductive layers 110 (SGDa) and 110 (SGDe) may be decreased or such auxiliary wirings SGDA may be omitted from the first embodiment, the third embodiment to the fifth embodiment, or the eighth embodiment. For example, the width in the Y-direction of the second part P2 of two auxiliary wirings SGDA' corresponding to the conductive layers 110 (SGDa) and 110 (SGDe) may be decreased or such auxiliary wirings SGDA' may be omitted from the seventh embodiment.

Tenth Embodiment

Figure 30:
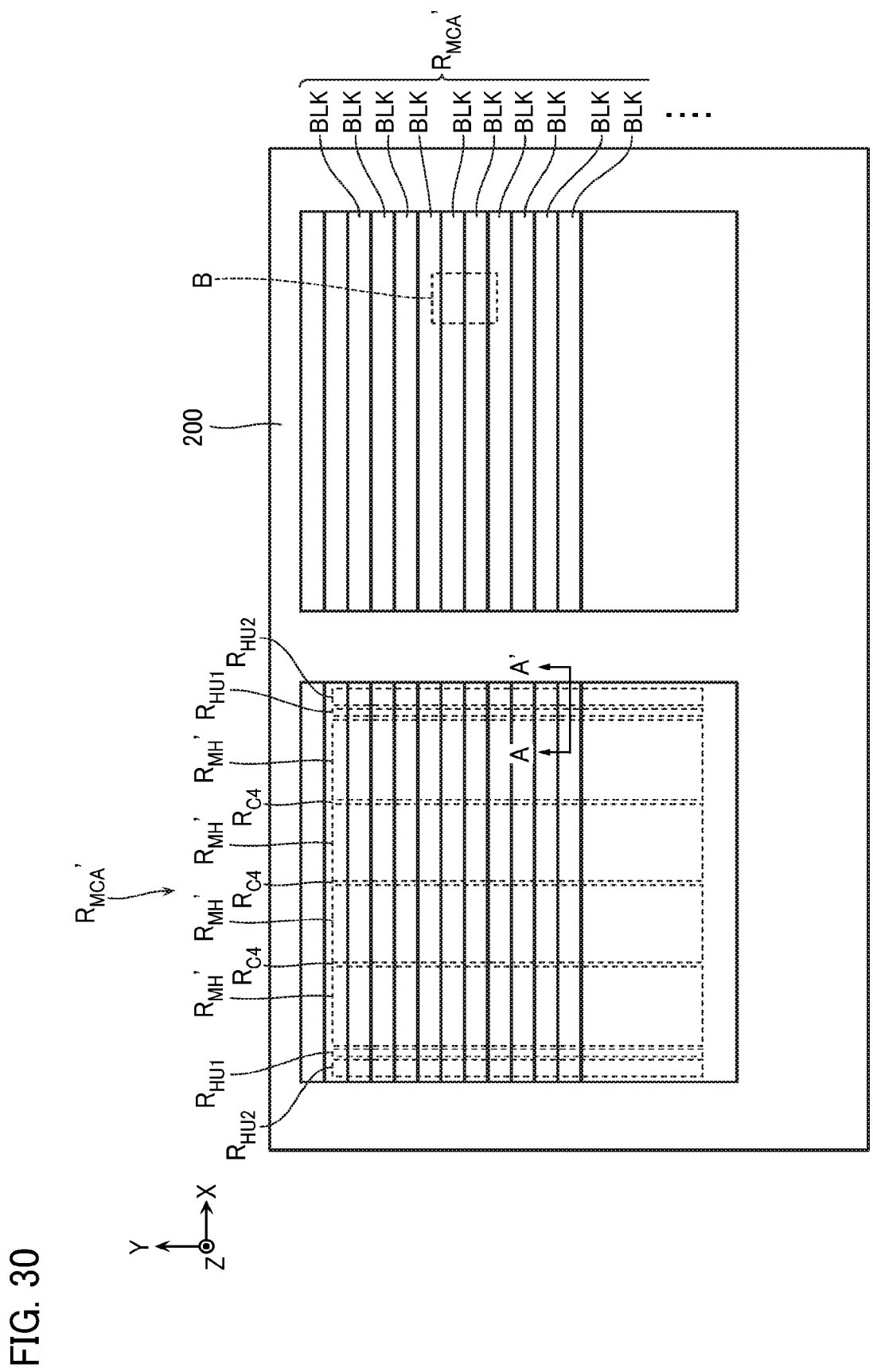
FIG. 30 is a schematic plan view illustrating a part of a configuration of a semiconductor memory device according to a tenth embodiment.
Figure 31:
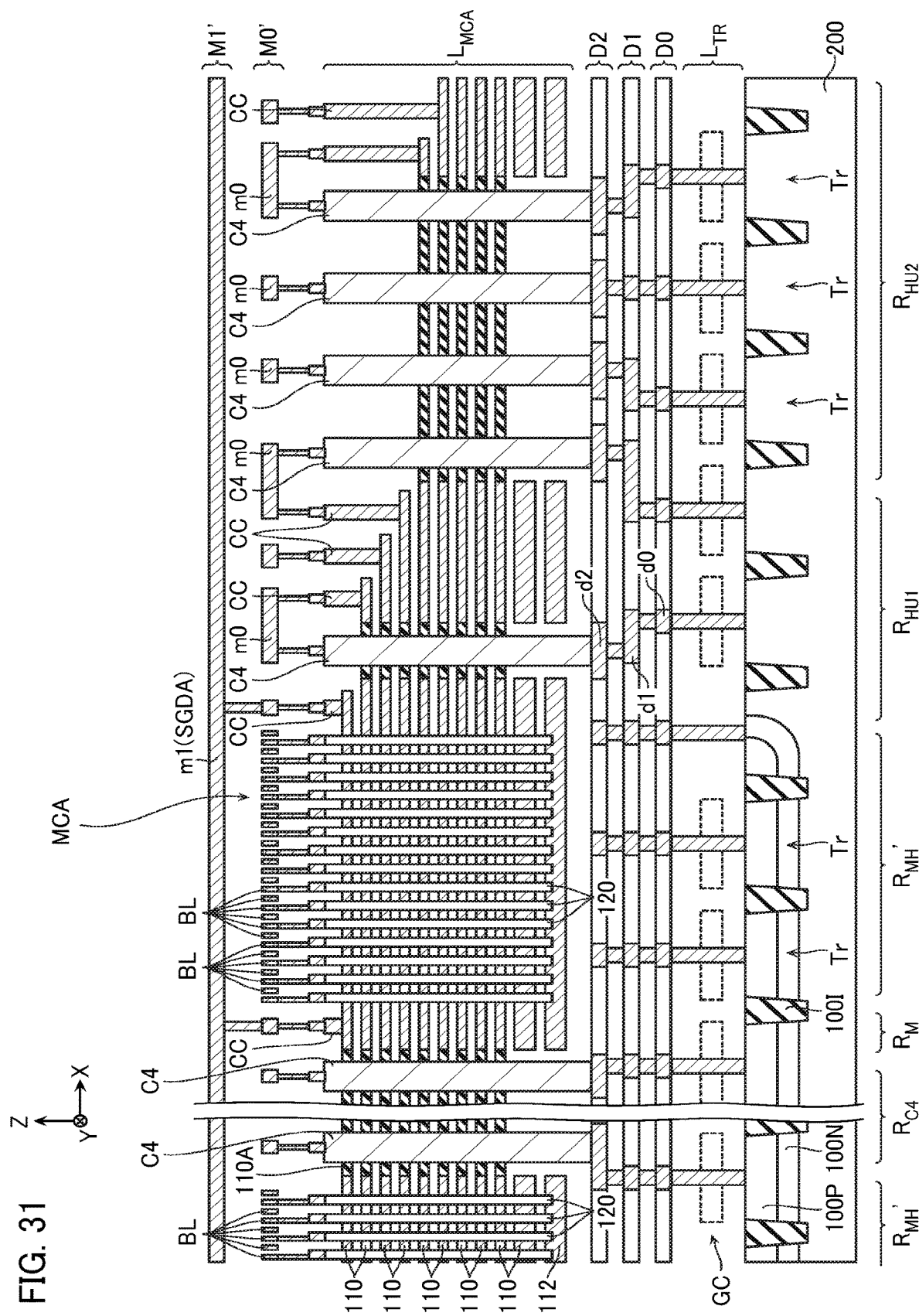
FIG. 31 is a schematic cross-sectional view taking the structure illustrated in FIG. 30 along the line A-A' and viewed in the direction of the arrow.
Figure 32:
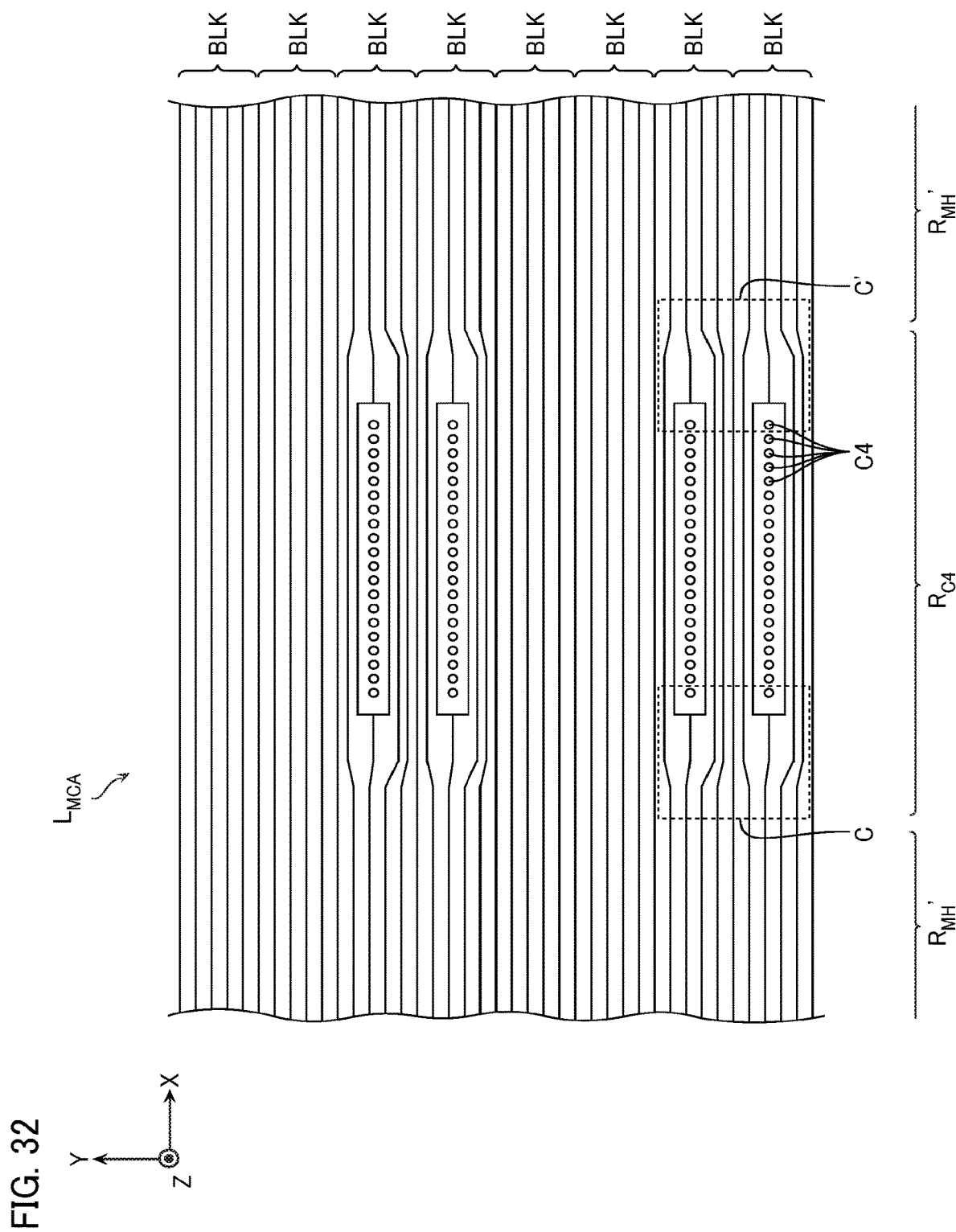
FIG. 32 is a schematic enlarged view of a portion illustrated in B in FIG. 30.
Figure 33:
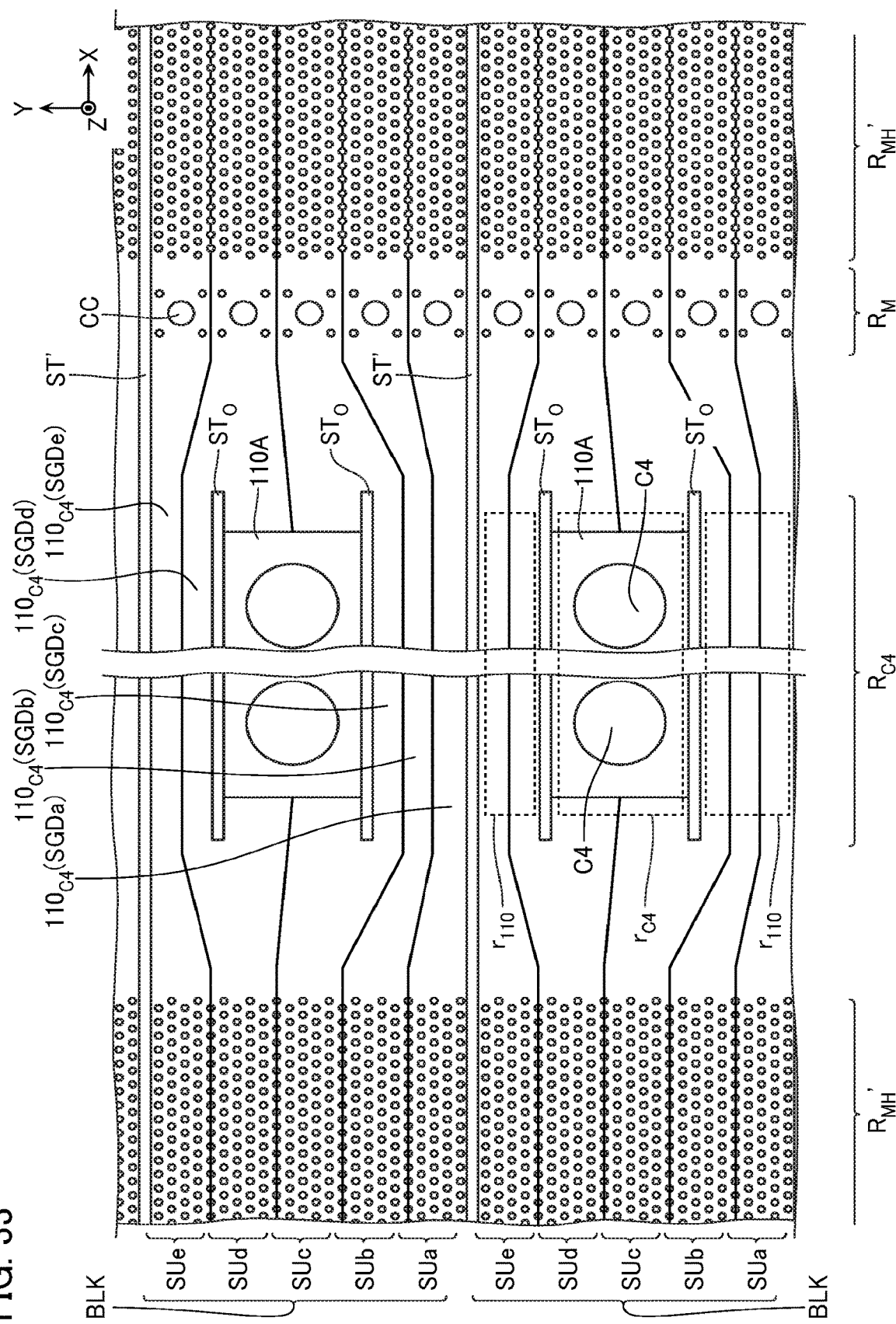
FIG. 33 is a schematic enlarged view of a portion illustrated in C in FIG. 32.
Figure 34:
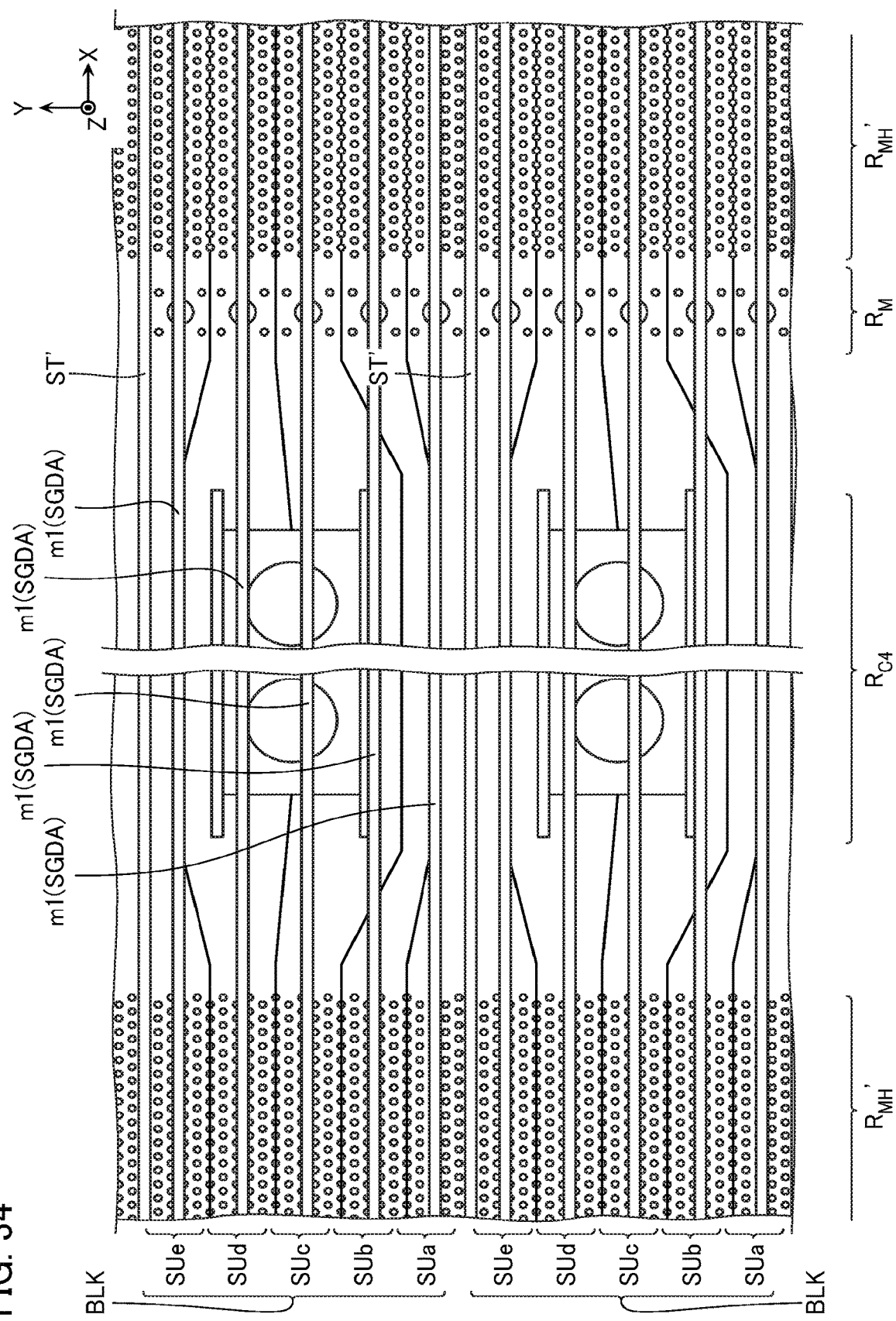
FIG. 34 is a schematic enlarged view of the portion illustrated in C in FIG. 32.

Next, with reference to FIG. 30 to FIG. 34, a semiconductor memory device according to a tenth embodiment will be described. FIG. 30 is a schematic plan view illustrating a part of a configuration of the semiconductor memory device according to the tenth embodiment. FIG. 31 is a schematic cross-sectional view taking a structure illustrated in FIG. 30 along the line A-A' and viewed in the direction of the arrow. FIG. 32 is a schematic enlarged view of a portion illustrated in B in FIG. 30. FIG. 33 and FIG. 34 are schematic enlarged views of a portion illustrated in C and a portion illustrated in C' in FIG. 32. However, a part of a configuration illustrated in FIG. 34 is omitted in FIG. 33.

In the second embodiment, the third embodiment, the fifth embodiment, and the seventh embodiment to the ninth embodiment, the contacts CC are disposed also in the source line contact region $R_{SLC}$ in addition to the first hook-up region $R_{HU1}$. The plurality of contacts CC disposed in the first hook-up region $R_{HU1}$ and the source line contact region $R_{SL}c$ are connected in parallel between the conductive layer 110 (SGD) and the auxiliary wiring SGDA and SGDA'. However, such a configuration is merely an example, and the specific configuration is adjustable as necessary. For example, the contact CC may be disposed in a region other than the first hook-up region $R_{HU1}$ or the source line contact region $R_{SLC}$. This contact CC may be connected between the conductive layer 110 (SGD) and the auxiliary wirings SGDA and SGDA'.

For example, as illustrated in FIG. 30, the semiconductor memory device according to the tenth embodiment includes a semiconductor substrate 200. In the illustrated example, two memory cell array region $R_{MCA}'$ arranged in the X-direction are disposed in the semiconductor substrate 200. The memory cell array region $R_{MCA}'$ includes a plurality of memory hole regions $R_{MH}'$ arranged in the X-direction and C4 contact regions $R_{C4}$ disposed between two memory hole regions $R_{MH}'$ arranged in the X-direction. The memory cell array region $R_{MCA}'$ has end portions in the X-direction where the first hook-up region $R_{HU1}$ and the second hook-up region $R_{HU2}$ farther from the memory hole region $R_{MH}$ than this are disposed.

In the memory cell array region $R_{MCA}'$, the plurality of memory blocks BLK arranged in the Y-direction are disposed. Between two memory blocks adjacent in the Y-direction, an inter-block structure ST' (FIG. 33) is disposed. The inter-block structure ST' is basically configured similarly to the inter-block structure ST according to the first embodiment. However, the inter-block structure ST' according to the tenth embodiment does not include the conductive layer 140, but is configured of an insulating layer of, for example, silicon oxide ($SiO_2$).

As illustrated in FIG. 31, the semiconductor memory device according to the tenth embodiment includes a transistor layer $L_{TR}$ disposed on the semiconductor substrate 200, a wiring layer D0 disposed on the upper side of the transistor layer $L_{TR}$, a wiring layer D1 disposed on the upper side of the wiring layer D0, a wiring layer D2 disposed on the upper side of the wiring layer D1, a memory cell array layer $L_{MCA}$ disposed on the upper side of the wiring layer D2, a wiring layer M0' disposed on the upper side of the memory cell array layer $L_{MCA}$, and a wiring layer M1' disposed on the upper side of the wiring layer M0'.

The semiconductor substrate 200 is basically configured similarly to the semiconductor substrate 100 according to the first embodiment. However, the surface of the semiconductor substrate 100 according to the first embodiment is connected to the lower end of the plurality of semiconductor columns 120 in the memory cell array region $R_{MCA}$. In the peripheral circuit area $R_{PC}$, the channel region and the like of the plurality of transistors that configure the peripheral circuit PC are disposed. On the other hand, a surface of the semiconductor substrate 200 according to the tenth embodiment is not connected to the lower end of the semiconductor column 120. The surface of the semiconductor substrate 200 according to the tenth embodiment includes a channel region and the like of the plurality of transistors configuring the peripheral circuit PC on both inside and outside of the memory cell array region $R_{MCA}'$.

The transistor layer $L_{TR}$ includes gate insulating films and gate electrodes GC of the plurality of transistors Tr constituting the peripheral circuit PC. The wiring layers D0, D1, D2 include respective pluralities of wirings d0, d1, d2 connected to the plurality of transistors Tr configuring the peripheral circuit PC.

The memory hole region $R_{MH}'$ of the memory cell array layer $L_{MCA}$ includes, for example, the plurality of conductive layers 110 arranged in the Z-direction, the plurality of semiconductor columns 120 extending in the Z-direction, the plurality of gate insulating films 130 each disposed between the plurality of conductive layers 110 and the plurality of semiconductor columns 120, and a conductive layer 112 connected to the lower ends of the plurality of semiconductor columns 120. The conductive layer 112 includes, for example, a semiconductor layer of, for example, silicon (Si) including N-type impurities, such as phosphorus (P).

In the C4 contact region $R_{C4}$ of the memory cell array layer $L_{MCA}$, for example, as illustrated in FIG. 33, two insulating layers $ST_O$ arranged in the Y-direction are disposed between two inter-block structures ST' arranged in the Y-direction. Between these two insulating layers $ST_O$, a contact connection sub-region $r_{C4}$ is disposed. Between the inter-block structure ST' and the insulating layer $ST_O$, a conductive layer connection sub-region $r_{110}$ is disposed. These regions extend in X-direct ion along the inter-block structure ST'.

The insulating layer $ST_O$ extends in the Z-direction, and is connected to the conductive layer 112 at the lower end. The insulating layer $ST_O$ includes, for example, silicon oxide ($SiO_2$).

The contact connection sub-region $r_{C4}$ includes a plurality of insulating layers 110A arranged in the Z-direction (FIG. 31) and a plurality of contacts C4 extending in the Z-direction.

The insulating layer 110A is an approximately plate-shaped insulating layer extending in the X-direction. The insulating layer 110A may include the insulating layer of, for example, silicon nitride (SiN). Between the plurality of insulating layers 110A arranged in the Z-direction, the insulating layers 101 of, for example, silicon oxide ($SiO_2$) are disposed.

For example, as illustrated in FIG. 32, a plurality of the contacts C4 are arranged in the X-direction. The contact C4 may include a stacked film of a barrier conductive film, such as titanium nitride (TiN), and a metal film, such as tungsten (W), or the like. The contacts C4 have outer peripheral surfaces each surrounded by the insulating layer 110A and the insulating layer 101, and are connected to these insulating layer 110A and insulating layer 101. Note that, for example, as illustrated in FIG. 31, the contact C4 extends in the Z-direction, connected to the wiring m0 in the wiring layer M0' at the upper end, and connected to the wiring d2 in the wiring layer D2 at the lower end.

The conductive layer connection sub-region $r_{110}$ includes, for example, as illustrated in FIG. 33, narrow-width portions $110_{C4}$ of the plurality of conductive layers 110 arranged in the Z-direction. For example, as illustrated in FIG. 33, the plurality of conductive layers 110 included in two memory hole regions $R_{MH}'$ adjacent in the X-direction are conducted with one another via these narrow-width portions $110_{C4}$. In the example in FIG. 33, one of two conductive layer connection sub-region $r_{110}$ corresponding to one memory block BLK includes the narrow-width portions $110_{C4}$ of the conductive layer 110 (SGDa), 110 (SGDb), 110 (SGDc). The other of these two conductive layer connection sub-region $r_{110}$ includes the narrow-width portions $110_{C4}$ of the conductive layer 110 (SGDd) and 110 (SGDe).

As illustrated in FIG. 33, no semiconductor column 120 is disposed between the conductive layer connection sub-region $r_{110}$ and the memory hole region $R_{MH}'$, and an intermediate region $R_M$ with a width in the Y-direction of the conductive layer 110 as same as a width in the memory hole region $R_{MH}'$ is disposed. In this embodiment, such an intermediate region $R_M$ includes five contacts CC corresponding to the conductive layers 110 (SGDa), 110 (SGDb), 110 (SGDc), 110 (SGDd), 110 (SGDe). As illustrated in FIG.

34, five auxiliary wirings SGDA are disposed corresponding to these five string units SU. As illustrated in FIG. 31, the plurality of contacts CC disposed in the first hook-up region $R_{HU1}$ and the intermediate region $R_M$ are connected in parallel between the conductive layers 110 (SGD) and the auxiliary wiring SGDA.

Note that, in the example in FIG. 30 to FIG. 34, the contacts CC are disposed at one end portions and the other end portions in the X-direction and one or a plurality of the intermediate regions $R_M$ of the conductive layers 110 (SGD). These plurality of contacts CC are connected in parallel between the conductive layer 110 (SGD) and the auxiliary wiring SGDA. However, such a configuration is merely an example, and the specific configuration is adjustable as necessary. For example, the contacts CC may be disposed only at the one end portions and the other end portions in the X-direction of the conductive layers 110 (SGD).

Figure 35:
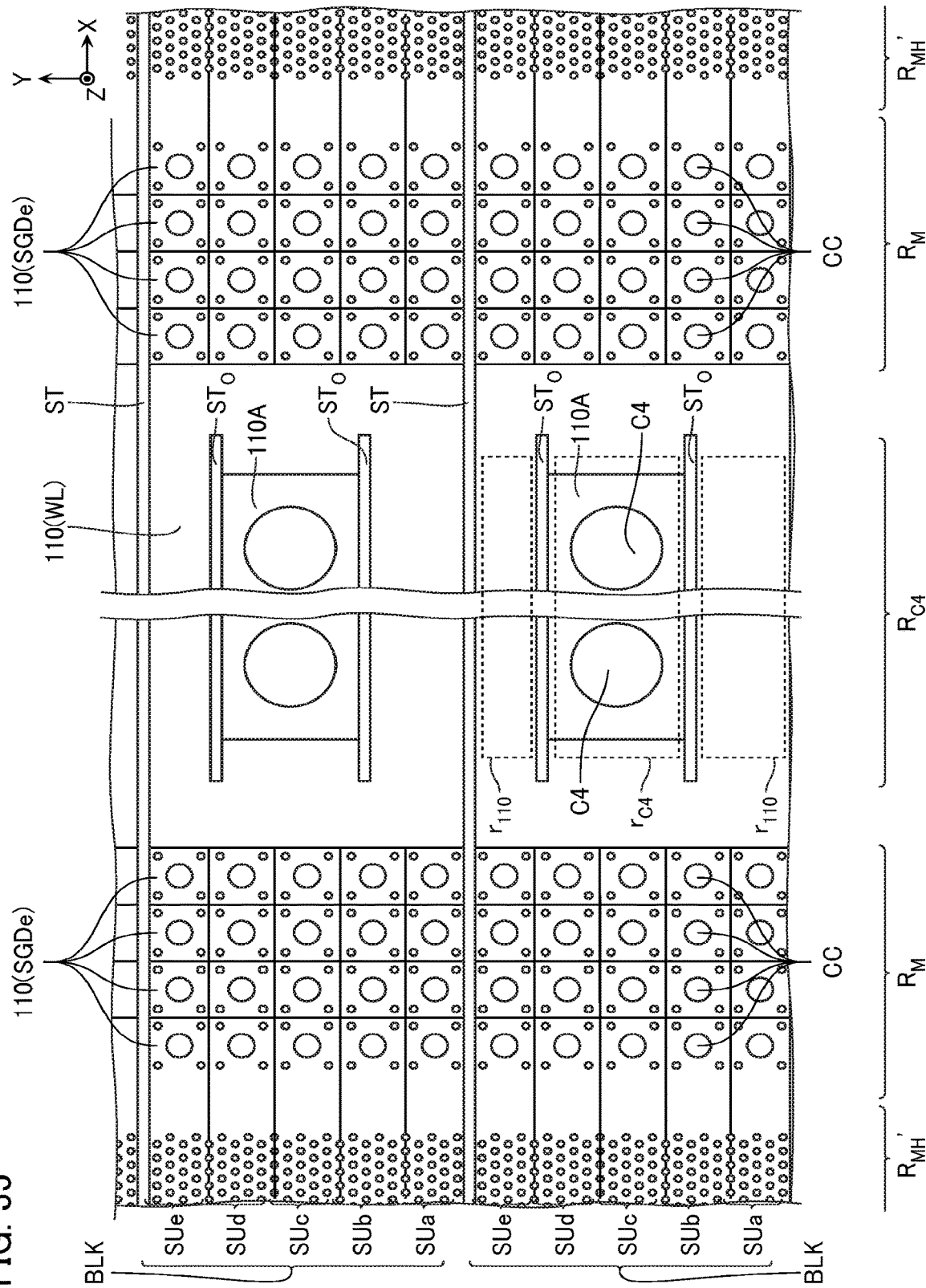
FIG. 35 is a schematic cross-sectional view illustrating another exemplary configuration of the semiconductor memory device according to the tenth embodiment.

In the example in FIG. 30 to FIG. 34, the conductive layer 110 (SGD) is continuously formed over the range from the first hook-up region $R_{HU1}$ in one side in the X-direction to the first hook-up region $R_{HU1}$ in the other side in the X-direction. Three or more contacts CC are connected in parallel between such conductive layer 110 (SGD) and auxiliary wiring SGDA. However, such a configuration is merely an example, and the specific configuration is adjustable as necessary. For example, as illustrated in FIG. 35, a part or all of the conductive layers 110 (SGD) may be separated into a plurality of portions in the X-direction in the above-described C4 contact region $R_{C4}$. Note that, in the example in FIG. 35, the conductive layer 110 (SGD) is not disposed in the C4 contact region $R_{C4}$.

In the example in FIG. 30 to FIG. 34, only one conductive layer 110 located on the uppermost layer among the plurality of conductive layers 110 arranged in the Z-direction is connected to the auxiliary wiring SGDA'. However, such a configuration is merely an example, and the specific configuration is adjustable as necessary. For example, as illustrated in FIG. 35, all the conductive layers 110 (SGD) arranged in the Z-direction may be connected to the auxiliary wiring SGDA. In such a case, two or more contacts CC each may be disposed or one contact CC each may be disposed corresponding to the plurality of conductive layers 110 (SGD).

In the example in FIG. 30 to FIG. 34, the auxiliary wiring SGDA is connected to the conductive layer 110 (SGD). However, such a configuration is merely an example, and the specific configuration is adjustable as necessary. For example, the auxiliary wiring SGDA may be connected to the conductive layer 110 (SGS) or may be connected to both the conductive layer 110 (SGS) and the conductive layer 110 (SGD).

In the example in FIG. 30 to FIG. 34, the semiconductor memory device includes the auxiliary wiring SGDA located above the bit line BL. However, such a configuration is merely an example, and the specific configuration is adjustable as necessary. For example, the semiconductor memory device according to the tenth embodiment may include the auxiliary wiring SGDA' located below the bit line BL.

The widths in the Y-direction of the auxiliary wirings SGDA and SGDA' corresponding to the drain side select gate lines SGDa and SGDe may be decreased or such auxiliary wirings SGDA and SGDA' may be omitted.

Another Embodiment

The semiconductor memory devices according to the first embodiment to the tenth embodiment have been described above. However, these configurations are merely examples, and the specific configuration is adjustable as necessary.

For example, the first embodiment to the tenth embodiment illustrate the structure fabricated by forming both the memory cell array MCA and the peripheral circuit PC on one wafer and dicing the wafer in this state. However, such a configuration is merely an example, and the specific configuration and the like is adjustable as necessary. For example, it is possible to consider a structure fabricated by forming the memory cell array MCA on one wafer and forming the peripheral circuit PC on another wafer, bonding these two wafers, and dicing these two bonding wafers. For example, as illustrated in FIG. 36, the structures illustrated in the first embodiment to the tenth embodiment are applicable to such a structure.

Figure 36:
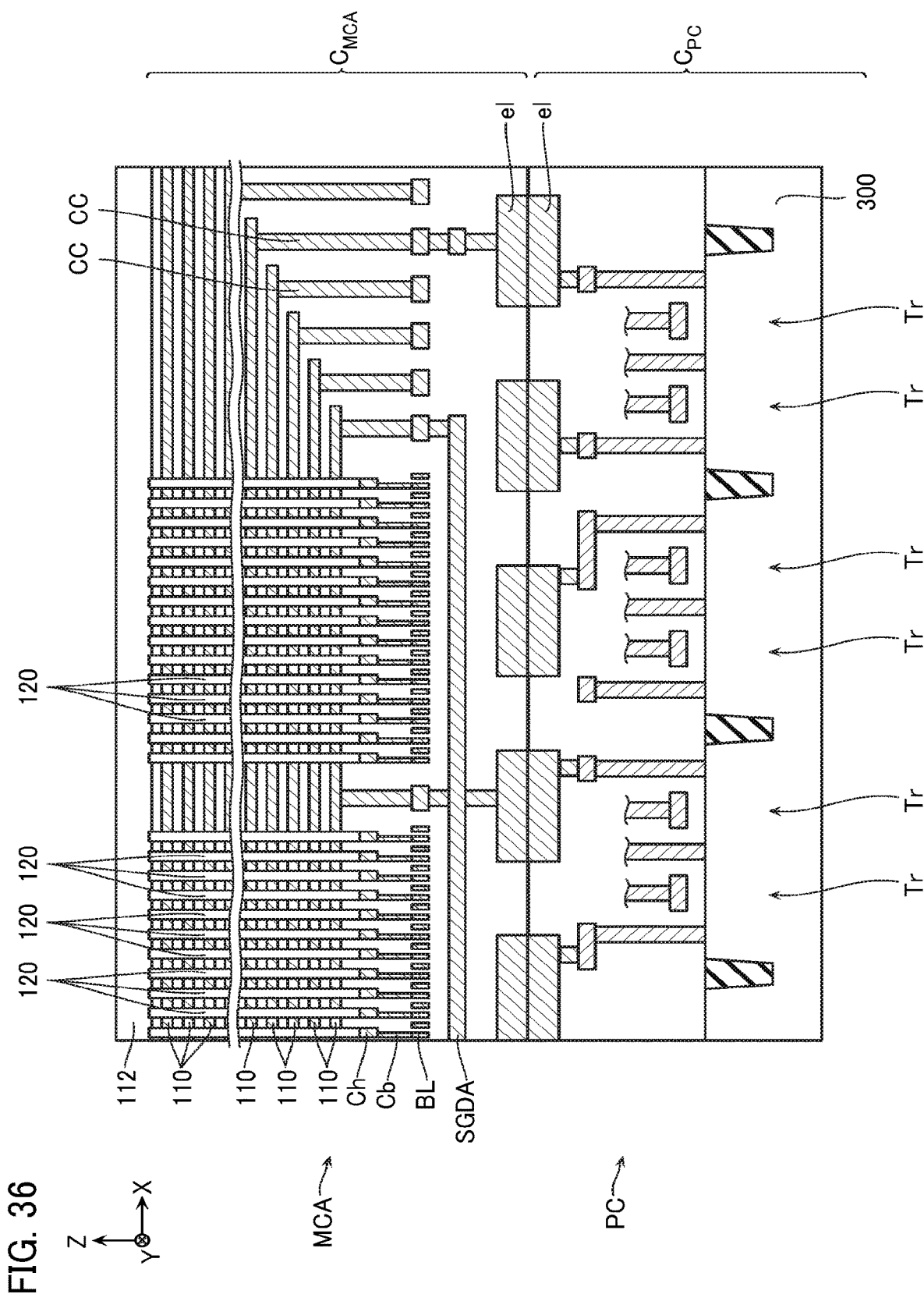
FIG. 36 is a schematic cross-sectional view illustrating a part of a configuration of a semiconductor memory device according to another embodiment.

Note that, the structure illustrated in FIG. 36 includes a chip $C_{FC}$ corresponding to the peripheral circuit PC and a chip $C_{MCA}$ corresponding to the memory cell array MCA. The chip $C_{PC}$ includes a semiconductor substrate 300, a plurality of transistors Tr formed in the semiconductor substrate 300, and a plurality of bonding electrodes el electrically connected to the plurality of these transistors Tr. The chip $C_{MCA}$ includes the plurality of conductive layers 110 configuring the memory cell array MCA, the plurality of semiconductor columns 120, and the gate insulating film 130 (not illustrated), the conductive layer 112, and the like.

Note that, in such a structure, there is a case where the substrate on a side of the memory cell array MCA is removed during the fabrication process. The semiconductor memory device fabricated in such a way does not have the substrate on the memory cell array MCA side, for example, as illustrated in FIG. 36. Here, as described above, the expressions such as "above" and "below" are based on the substrate in this specification. Accordingly, in the structure as illustrated in FIG. 36, the vertical positional relation and the like between the configurations are specified based on the substrate on which the peripheral circuit PC is formed. As the result, as illustrated in FIG. 36, the vertical positional relation and the like between the configurations may be opposite from the first embodiment to the tenth embodiment in some cases. Note that, when the substrate on the memory cell array MCA side is not removed during the fabrication process, the vertical positional relation and the like may be based on the substrate on the memory cell array MCA side or may be based on the substrate on a side of the peripheral circuit PC.

In the first embodiment to the tenth embodiment, for example, as illustrated in FIG. 2 or FIG. 30, the first hook-up region $R_{HU1}$ and the second hook-up region $R_{HU2}$ are each disposed in the one side and the other side in the X-direction of the plurality of memory hole regions $R_{MH}$. However, such a configuration is merely an example, and the specific configuration is adjustable as necessary. For example, the first hook-up region $R_{HU1}$ and the second hook-up region $R_{HU2}$ may be disposed in a center position in the X-direction of the memory cell array region $R_{MCA}$. The memory hole regions $R_{MH}$, $R_{MH}'$ may each be disposed in the one sides and the other sides in the X-direction of the first hook-up region $R_{HU1}$ and the second hook-up region $R_{HU2}$. In such a case, the contact CC is not necessarily disposed at at least one of the one end portion and the other end portion in the X-direction of the conductive layer 110 (SGD). In such a case, for example, it is possible to dispose the contact CC in the above-described source line contact region $R_{SLC}$, C4 contact region $R_{C4}$, and the like.

In the first embodiment to the tenth embodiment, the plurality of conductive layers 110 configuring word line WL and the plurality of conductive layers 110 configuring the drain side select gate line SGD and the source side select gate line SGS include the same material. The thicknesses in the Z-direction of the plurality of these conductive layers 110 are also the same. However, such a configuration is merely an example, and the specific configuration is adjustable as necessary. For example, at least one of the conductive layer configuring the drain side select gate line SGD and the conductive layer configuring the source side select gate line SGS may include a different material than that of the conductive layer 110 (WL), or may have a thickness larger than that of the conductive layer 110 (WL) in the Z-direction. In such a case, for example, instead of using the plurality of conductive layers 110 arranged in the Z-direction as the drain side select gate line SGD or the source side select gate line SGS, one layer of conductive layer may be used as the drain side select gate line SGD or the select gate line SGS.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of first conductive layers arranged in a first direction intersecting with a surface of the substrate, the plurality of first conductive layers extending in a second direction intersecting with the first direction;
   a second conductive layer arranged with the plurality of first conductive layers in the first direction, the second conductive layer extending in the second direction, the second conductive layer disposed at a position farther from the substrate than the plurality of first conductive layers or a position closer to the substrate than the plurality of first conductive layers;
   a third conductive layer arranged with the plurality of first conductive layers in the first direction, the third conductive layer arranged with the second conductive layer in the second direction, the third conductive layer extending in the second direction;
   a first semiconductor column extending in the first direction, the first semiconductor column penetrating the plurality of first conductive layers and the second conductive layer;
   a second semiconductor column extending in the first direction, the second semiconductor column penetrating the plurality of first conductive layers and the third conductive layer;
   a first electric charge accumulating film disposed between the plurality of first conductive layers and the first semiconductor column;
   a second electric charge accumulating film disposed between the plurality of first conductive layers and the second semiconductor column;
   a first wiring extending in the second direction, the first wiring disposed at a position farther from the plurality of first conductive layers than the second conductive layer and the third conductive layer;
   a first contact disposed between an end portion in the second direction of the second conductive layer and the first semiconductor column, the first contact electrically connected to the second conductive layer and the first wiring;
   a second contact disposed between an end portion in the second direction of the third conductive layer and the second semiconductor column, the second contact electrically connected to the third conductive layer and the first wiring;
   a second wiring extending in a third direction intersecting with the first direction and the second direction, the second wiring electrically connected to the first semiconductor column; and
   a third wiring extending in the third direction, the third wiring electrically connected to the second semiconductor column,
   wherein the second wiring is disposed between the second conductive layer and the first wiring, and
   wherein the third wiring is disposed between the third conductive layer and the first wiring.

2. The semiconductor memory device according to claim 1, further comprising:
   a third contact electrically connected to the second conductive layer and the first wiring; and
   a fourth contact electrically connected to the third conductive layer and the first wiring,
   wherein the first semiconductor column is disposed between the first contact and the third contact, and
   wherein the second semiconductor column is disposed between the second contact and the fourth contact.

3. The semiconductor memory device according to claim 1, further comprising:
   a fourth conductive layer disposed between the plurality of first conductive layers and the second conductive layer, the fourth conductive layer extending in the second direction;
   a fifth conductive layer disposed between the plurality of first conductive layers and the third conductive layer, the fifth conductive layer extending in the second direction;
   a fifth contact electrically connected to the fourth conductive layer and the first wiring; and
   a sixth contact electrically connected to the fifth conductive layer and the first wiring.

4. A device comprising:
   a substrate;
   a plurality of first conductive layers arranged in a first direction intersecting with a surface of the substrate, the plurality of first conductive layers extending in a second direction intersecting with the first direction;
   a second conductive layer arranged with the plurality of first conductive layers in the first direction, the second conductive layer extending in the second direction;
   a third conductive layer arranged with the plurality of first conductive layers in the first direction, the third conductive layer arranged with the second conductive layer in the second direction, the third conductive layer extending in the second direction;
   a first semiconductor column extending in the first direction, the first semiconductor column penetrating the plurality of first conductive layers and the second conductive layer;

a second semiconductor column extending in the first direction, the second semiconductor column penetrating the plurality of first conductive layers and the third conductive layer;

a first wiring extending in the second direction, the first wiring disposed at a position farther from the plurality of first conductive layers than the second conductive layer and the third conductive layer, the first wiring electrically connected to the second conductive layer and the third conductive layer, wherein the first wiring overlaps with the plurality of first conductive layers, the second conductive layer and the third conductive layer in the first direction;

a second wiring extending in a third direction intersecting with the first direction and the second direction, the second wiring electrically connected to the first semiconductor column; and a third wiring extending in the third direction, the third wiring electrically connected to the second semiconductor column, wherein the second wiring is disposed between the second conductive layer and the first wiring, and wherein the third wiring is disposed between the third conductive layer and the first wiring.

5. The device according to claim 4, further comprising:
a first contact electrically connected to the second conductive layer and the first wiring;
a second contact electrically connected to the third conductive layer and the first wiring;
a third contact electrically connected to the second conductive layer and the first wiring; and
a fourth contact electrically connected to the third conductive layer and the first wiring,
wherein the first semiconductor column is disposed between the first contact and the third contact, and
wherein the second semiconductor column is disposed between the second contact and the fourth contact.

6. The device according to claim 4, further comprising:
a fourth conductive layer disposed between the plurality of first conductive layers and the second conductive layer, the fourth conductive layer extending in the second direction;
a fifth conductive layer disposed between the plurality of first conductive layers and the third conductive layer, the fifth conductive layer extending in the second direction;
a first contact electrically connected to the second conductive layer and the first wiring;
a second contact electrically connected to the third conductive layer and the first wiring;
a fifth contact electrically connected to the fourth conductive layer and the first wiring; and
a sixth contact electrically connected to the fifth conductive layer and the first wiring.

7. The device according to claim 4,
wherein the plurality of first conductive layers are disposed between the substrate and the second wiring and between the substrate and the third wiring.

8. The device according to claim 4, further comprising:
a plurality of transistors disposed on the substrate,
wherein the second wiring and the third wiring are disposed between the plurality of transistors and the plurality of first conductive layers.

9. The device according to claim 4, further comprising:
a fourth conductive layer arranged with the plurality of first conductive layers in the first direction, the fourth conductive layer arranged with the second conductive layer in the third direction;

a third semiconductor column extending in the first direction, the third semiconductor column penetrating the plurality of first conductive layers and the fourth conductive layer; and a fourth wiring extending in the fourth direction, the second wiring arranged with the first wiring in the third direction, the fourth wiring electrically connected to the fourth conductive layer, wherein a width in the third direction of the fourth wiring is smaller than a width in the third direction of the first wiring.

10. The device according to claim 4, further comprising:
a fourth conductive layer arranged with the plurality of first conductive layers in the first direction, the fourth conductive layer arranged with the second conductive layer in the third direction; and a third semiconductor column extending in the first direction, the third semiconductor column penetrating the plurality of first conductive layers and the fourth conductive layer, wherein a number of contacts connected to the fourth conductive layer is less than a number of contacts connected to the second conductive layer.

11. The device according to claim 4,
wherein the second conductive layer and the third conductive layer are disposed at a position closer to the substrate than the plurality of first conductive layers, and
wherein the first wiring is disposed at a position closer to the substrate than the plurality of first conductive layers, the second conductive layer and the third conductive layer.

12. A device comprising:
a substrate;
a plurality of conductive layers disposed above the substrate in a first direction, the plurality of conductive layers extending in a second direction traversing the first direction;
a plurality of semiconductor columns penetrating the plurality of conductive layers in the first direction;
a plurality of bit lines disposed above the plurality of semiconductor columns in the first direction, the plurality of bit lines extending in a third direction traversing the first direction and the second direction, each of the plurality of bit lines coupled to a corresponding one of the plurality of semiconductor columns; and
a first wiring extending in the second direction, the first wiring disposed over the plurality of bit lines in the first direction, the first wiring electrically connected to two or more conductive layers of the plurality of conductive layers, the two or more conductive layers farther from the substrate than the other conductive layers of the plurality of conductive layers.

13. The device of claim 12, further comprising:
a first contact electrically connected to a first conductive layer of the plurality of conductive layers and the first wiring, the first contact disposed between one end of the first conductive layer and the plurality of semiconductor columns; and
a second contact electrically connected to a second conductive layer of the plurality of conductive layers and the first wiring, the second contact disposed between one end of the second conductive layer and the plurality of semiconductor columns.

14. The device of claim 13, wherein the first conductive layer and the second conductive layer are separated from each other in the second direction.

15. The device of claim 12,
wherein the first wiring is electrically connected to a first conductive layer, a second conductive layer, and a third conductive layer of the plurality of conductive layers, and
wherein the first conductive layer, the second conductive layer, and the third conducive layer are separated from each other along the second direction.

16. The device of claim 12, further comprising:
a set of memory cells formed at intersections of a subset of the plurality of conductive layers and the plurality of semiconductor columns.

* * * * *